United States Patent
Gottesman

(10) Patent No.: US 6,614,370 B2
(45) Date of Patent: Sep. 2, 2003

(54) REDUNDANT COMPRESSION TECHNIQUES FOR TRANSMITTING DATA OVER DEGRADED COMMUNICATION LINKS AND/OR STORING DATA ON MEDIA SUBJECT TO DEGRADATION

(76) Inventor: Oded Gottesman, 791-D Laurel Walk, Santa Barbara, CA (US) 93117

( * ) Notice: Subject to any disclaimer, the term of this patent is extended or adjusted under 35 U.S.C. 154(b) by 0 days.

(21) Appl. No.: 10/056,891

(22) Filed: Jan. 24, 2002

(65) Prior Publication Data

US 2002/0101369 A1 Aug. 1, 2002

Related U.S. Application Data

(60) Provisional application No. 60/264,494, filed on Jan. 26, 2001.

(51) Int. Cl.[7] .................................................. H03M 7/00
(52) U.S. Cl. ....................................................... 341/94
(58) Field of Search ........................... 341/94; 714/703; 370/241

(56) References Cited

U.S. PATENT DOCUMENTS 6,487,686 B1 * 11/2002 Yamazaki ..................... 341/94

* cited by examiner

Primary Examiner—Brian Young
(74) Attorney, Agent, or Firm—Morgan, Lewis & Bockius LLP

(57) ABSTRACT

Encoding/decoding systems and methods for use with data signals representing speech, audio, video, and/or other types of information, including, but not limited, to EKG, surround sound, seismic signals, and others. These systems and methods encode signal parameters into a plurality of frames, each frame having a predetermined number of bits. The encoder encodes signals into frames that are of longer duration than a transmission (or storage) interval, except in cases where signals may be characterized by an axis other than time, such as image or video-coded signals, wherein the encoder codes signals into frames that are larger than the coded segment. When no bits are lost during data transmission (or storage), the decoder uses the received (or retrieved) bits to reconstruct segments having a length equal to the transmission (or storage) interval. When a frame erasure occurs, the decoder uses the received (or retrieved) bits to reconstruct segments having a length that is greater than the transmission (or storage) interval. This technique reduces the need for interpolation- or extrapolation-based techniques for error concealment. The invention can also be used as an enhancement layer for standard or other prior art coding systems. In such cases, an existing coding scheme may operate as a base layer, and the present invention can be used as enhancement layer for less than ideal communication environments, by coding additional look-ahead and/or look-back parameters.

11 Claims, 16 Drawing Sheets

FULL FRAME LOOK-AHEAD CODED SECTION (NO NEED FOR ERROR CONCEALMENT FOR ONE ERASED FRAME)

MULTIPLE FRAME LOOK-AHEAD CODED SECTION (NO NEED FOR ERROR CONCEALMENT FOR K ERASED FRAMES)

PARTIAL FRAME LOOK-AHEAD AND LOOK-BACK CODED SECTIONS (PARTIAL ERROR CONCEALMENT SECTION)

FULL FRAME LOOK-AHEAD AND LOOK-BACK CODED SECTIONS (NO NEED FOR ERROR CONCEALMENT FOR ONE ERASED FRAME)

MULTIPLE FRAME LOOK-AHEAD AND LOOK-BACK CODED SECTIONS (NO NEED FOR ERROR CONCEALMENT FOR K ERASED FRAMES)

FIG. 13
TWO DIMENSIONAL SIGNAL HAVING SUPER-FRAME OVERLAPPING ALONG THE X AND THE Y AXES
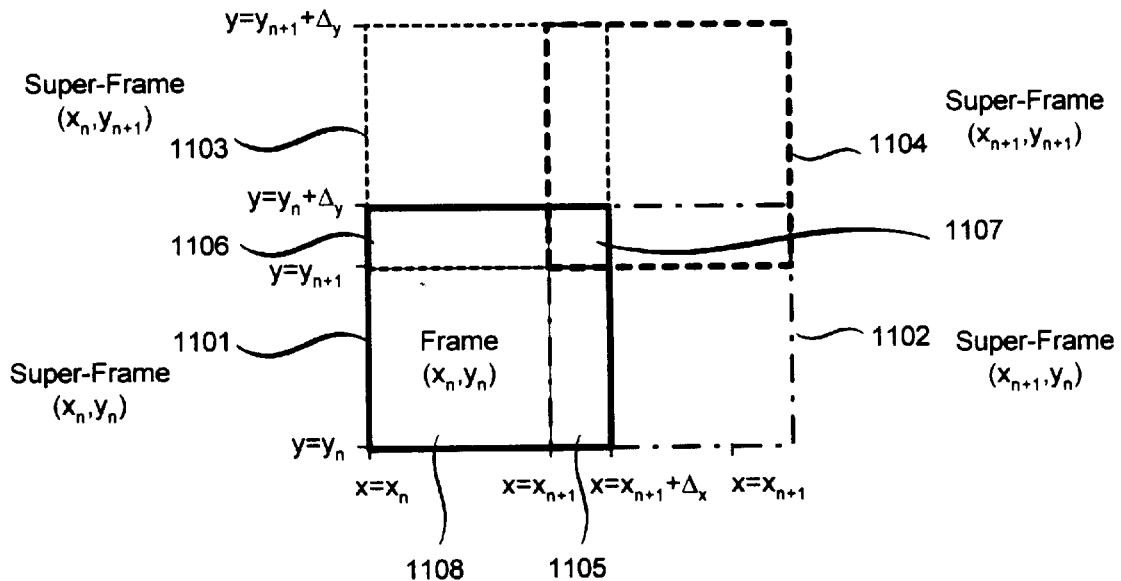
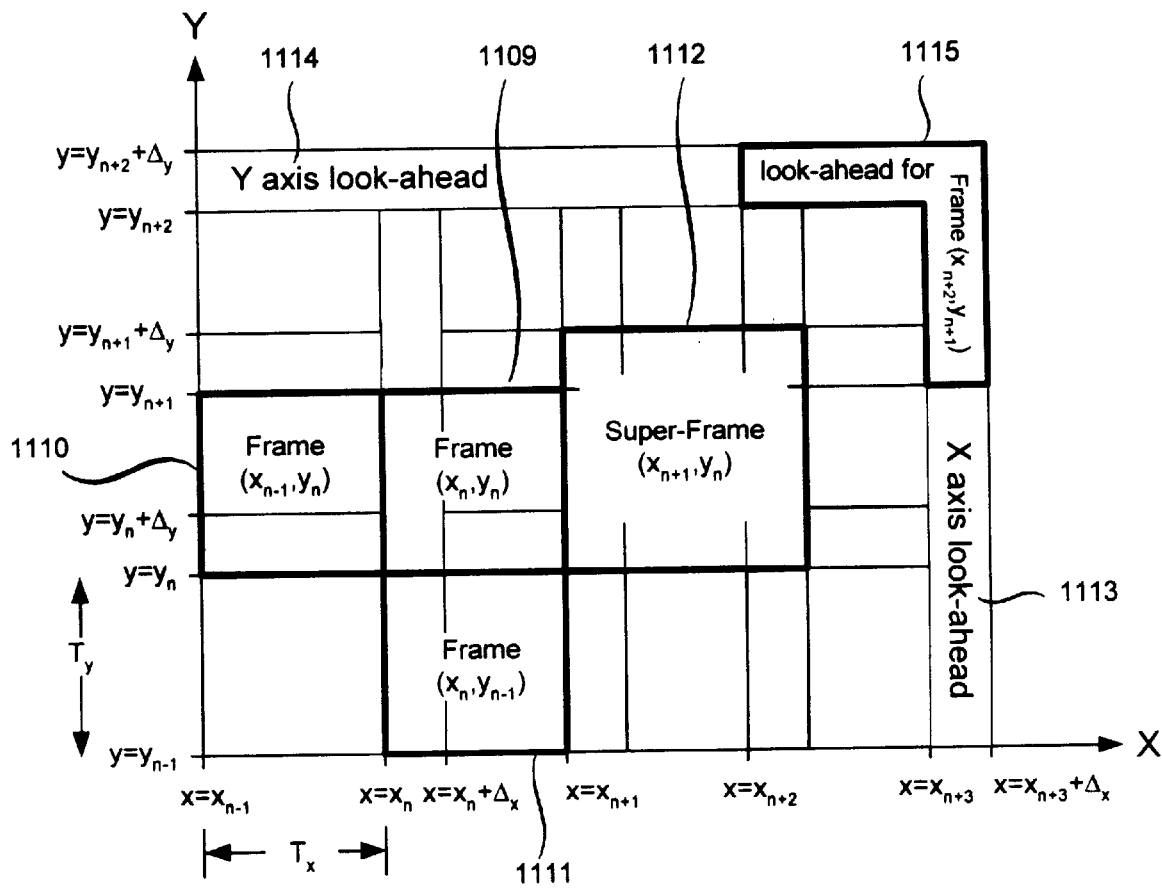

THREE DIMENSIONAL SIGNAL HAVING SUPER-FRAME OVERLAPPING ALONG THE X AXIS

THREE DIMENSIONAL SIGNAL HAVING SUPER-FRAME OVERLAPPING ALONG THE Y AXIS

REDUNDANT COMPRESSION TECHNIQUES FOR TRANSMITTING DATA OVER DEGRADED COMMUNICATION LINKS AND/OR STORING DATA ON MEDIA SUBJECT TO DEGRADATION

This Application is based upon my Provisional Patent Application filed on Jan. 26, 2001 and assigned Serial No. 60/264,494.

NOTICE OF MATERIAL SUBJECT TO COPYRIGHT PROTECTION

Material in this patent document may be subject to copyright protection under the copyright laws of the United States and other countries. The owner of the copyright has no right to exclude facsimile reproduction of the patent specification as it appears in files or records which are available to members of the general public from the United States Patent and Trademark Office, but owner otherwise reserves any and all copyright rights therein.

BACKGROUND OF THE INVENTION

1. Field of the Invention

This invention relates generally to data communications and, more specifically, to techniques for implementing redundant data compression in communication or storage systems which are vulnerable to errors. Such systems may be used to compress signals such as speech, audio, and/or video.

2. Description of Prior Art

Many communication systems, such as cellular telephones, personal communications systems, voice-over-Internet protocol (VoIP), as well as audio or video over packet-based networks, rely on electromagnetic or wired communications links to convey information from one place to another. These communications links generally operate in less than ideal environments with the result that fading, attenuation, multipath distortion, interference, network congestion, network delay, and other adverse propagational effects may occur. Similarly, such less than ideal environments may also occur in storage systems. In cases where information is represented digitally as a series of bits, such propagational effect may cause the loss or corruption of one or more bits. Oftentimes, the bits are organized into frames, such that predetermined fixed number of bits comprises a frame. A frame erasure refers to the loss or substantial corruption of a bit or a set of bits communicated to the receiver.

To provide for an efficient utilization of a given bandwidth (or storage space), communication (or storage) systems directed to signal communications (or storage) often use signal coding techniques. Such signal can be for example speech, audio, or video. Many existing signal coding techniques are executed on a frame-by frame basis. For speech coding, such frame is about 10–80 milliseconds in length. The signal coder extracts parameters that are representative of the signal. These parameters are then quantized and transmitted (or stored) via the communications channel (or storage medium).

If a frame of bits is lost, then the receiver has no bits to interpret during a given time interval. Under such circumstances, the receiver may produce a meaningless or distorted result. Although it is possible to replace the lost frame with a new frame, estimated from the previous or the next frame, this introduces inaccuracies which may not be tolerated or desirable in the context of many real-world applications. In predictive coding systems, such errors will then propagate to all the future frames. The result is a poorly-reconstructed and distorted signal.

The problem of packet loss in packet-switch networks employing speech, audio, or video coding techniques, is very similar to the problem of frame erasure in the context of Internet, or wireless communication links. Due to packet loss, a signal decoder may either fail to receive a frame or receive a frame having a significant number of missing bits. In either case, the signal decoder is presented with essentially the same problem: the need to reconstruct a signal, despite the loss of compressed signal information. Both frame erasure and packet loss concern a communication channel (or storage medium) problem which results in the loss of transmitted (or stored) bits. Therefore, for purposes of the present disclosure, the term "frame erasure" may be deemed synonymous with "packet loss".

SUMMARY OF THE INVENTION

An improved signal coding technique encodes signal parameters into a plurality of overlapped super-frames, each super-frame having a predetermined number of bits. These encoded signal parameters may be decoded into plurality of non-overlapping frames. Redundant information derived from an overlapping portion of the super-frames is used to reconstruct frames which have been subjected to frame erasure. This technique reduces or eliminates the need for prior art error concealment schemes, which are commonly based on interpolation or extrapolation (or both), to reconstruct an approximation of the signal within the erased frame or frames. The invention can also be utilized as an enhancement layer added to standard or other prior art coding systems. In such cases, an existing, possibly standard, coding scheme may operate as a base layer, and the present invention can be used as enhancement layer for less than ideal communication (or storage) environments.

BRIEF DESCRIPTION OF THE DRAWINGS

FIG. 13 is a data structure diagram of a two-dimensional signal compression method in accordance with a preferred embodiment disclosed herein for use in conjunction with the systems and methods of FIGS. 1–3, 11, and/or 12, in which super-frames have overlap $\Delta_x$ along the X axis and overlap $\Delta_y$ along the Y axis. The encoder encodes a super-frame including a frame and some X axis look-ahead information, as well as some Y axis look-ahead information. This encoding is accomplished such that, along the X axis, as well as the Y axis, the super-frame is longer than one frame, but shorter than two frames. Whenever frame erasure occurs, the decoder decodes a previous super-frame and provides error concealment techniques, which can be based upon interpolation or extrapolation (or both), to reconstruct an approximation of a portion of the erased frame along each axis;

DETAILED DESCRIPTION OF THE PRESENT EMBODIMENT

Figure 1:
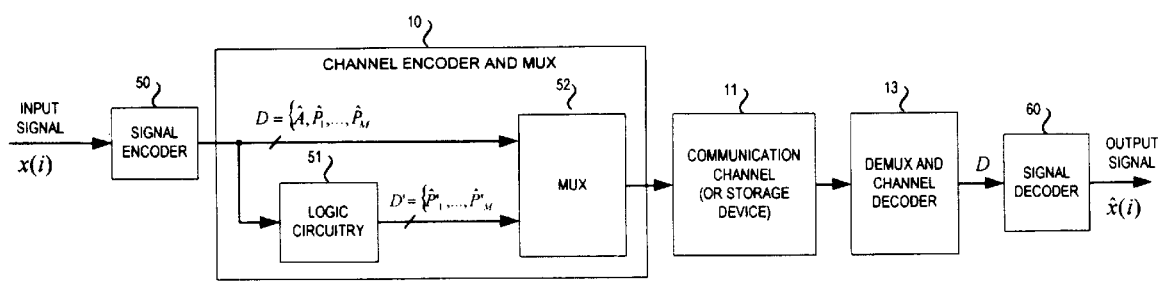
FIG. 1 is a hardware block diagram setting forth a signal coding system in accordance with a present embodiment disclosed herein.

Refer to FIG. 1, which is a is a hardware block diagram setting forth a signal coding system in accordance with a preferred embodiment of the invention to be described hereinafter. A signal, represented as x(i), is coupled to a conventional signal encoder 50. Signal encoder may include elements such as an analog-to-digital converter, one or more frequency-selective filters, digital sampling circuitry, and/or an input transformation (denoted by $\hat{T}(n)$).

Irrespective of the specific internal structure of the signal encoder 50, this encoder produces an output in the form of a digital bit stream D. The form of a digital bit stream D, is the encoded data of x(i), and hence, includes "parameters" (denoted by $D=\{\hat{T}, \hat{P}_1, \ldots, \hat{P}_M\}$ which correspond to one or more characteristics of x(i). Since x(i) is a function which changes with time, the output signal of the signal decoder is periodically updated at regular time intervals. Therefore, during a first time interval $T_1$, the output signal comprises a set of values corresponding to parameters $D=\{\hat{T}, \hat{P}_1, \ldots$ $,\hat{P}_M\}$, during time interval $T_1$. During a first time interval $T_2$, the value of parameters $D=\{\hat{T}, \hat{P}_1, \ldots, \hat{P}_M\}$, may change, taking on values differing from those of the first interval. Parameters collected during time interval $T_1$ are represented by a plurality of bits (denoted as $D_1$) comprising a first frame, and parameters collected during time interval $T_2$ are represented by a plurality of bits $D_2$ comprising a second frame. Therefore $D_n$ refers to a set of bits representing all parameters collected during the n-th time interval.

The output signal encoder 50 is coupled to MUX 10 and may or may not be coupled to logic circuitry 51. MUX 10 is a conventional digital multiplexer device which in the present context, combines the plurality of bits representing a given $D_n$ onto single signal line. $D_n$ is multiplexed onto this signal line together with or without a series of bits denoted as $D'_n$, produced by logic circuitry 51.

The output of multiplexer 10, including a multiplexed version of $D'_n$ and $D'_n$, is conveyed to another location over a communications channel (or is stored on a storage medium) 11. At the receiving end of the channel, the received (or read from storage medium) signal, is fed to the demultiplexer DEMUX 13, that processes it to retrieve $D'_n$ and D'n. The $D'_n$ and $D'_n$ are then processed by signal decoder 60 to reconstruct the output signal $\hat{x}(i)$. Suitable devices for implementation of decoders for signals such as speech, audio or video decoder are well known to those skilled in the art. Signal decoder 60 is configured to decode signal which was encoded by the signal encoder 50.

Figure 2:
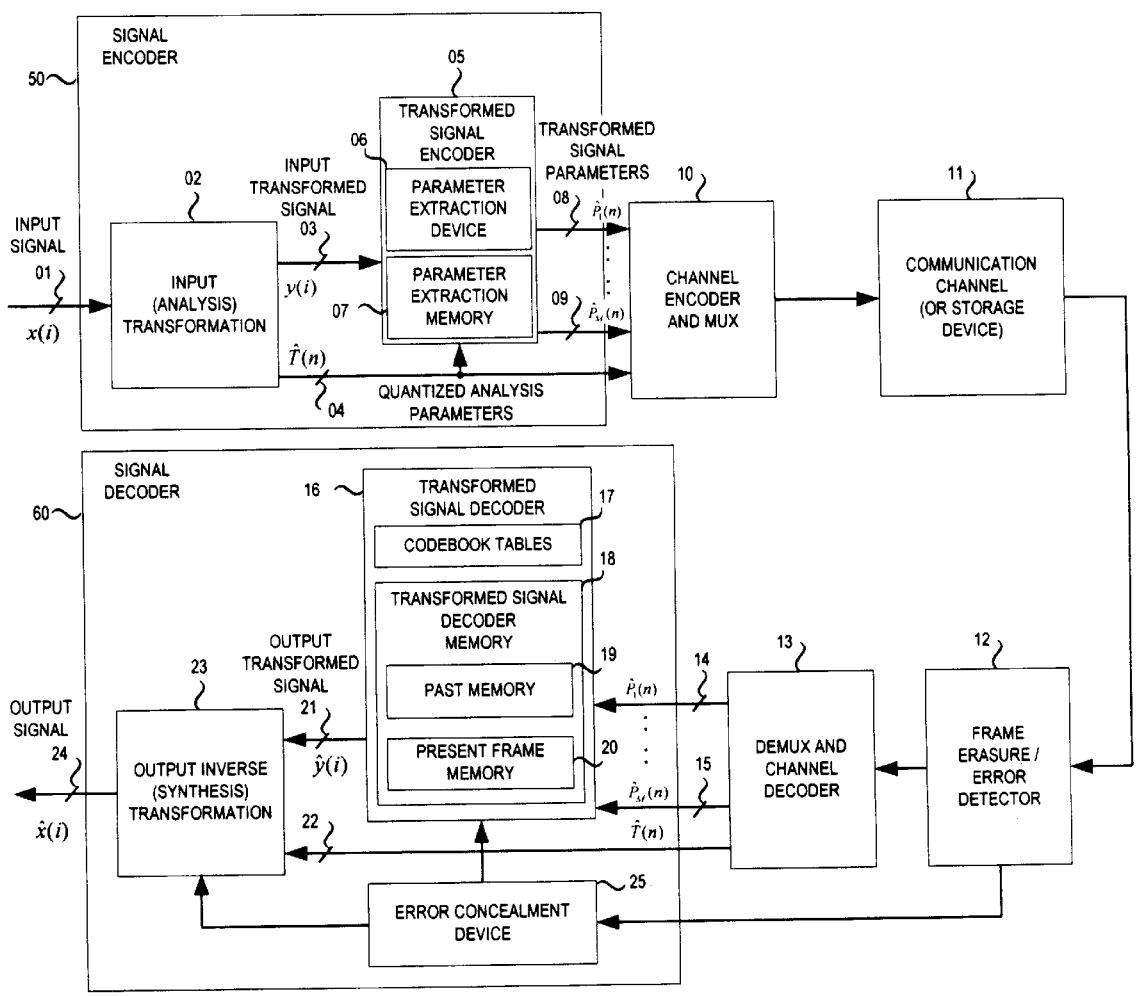
FIG. 2 is a hardware block diagram setting forth a signal coding system in accordance with a present embodiment disclosed herein.

FIG. 2 is a hardware block diagram setting forth a signal coding system in accordance with a present embodiment disclosed herein. A signal is fed to input 01 of an input (analysis) transformation 02. The transformation 02 may or may not be derived from the input signal. The transformation 02 may or may not be quantized. If the transformation 02 is quantized, then its parameters are placed in signal line 04. The transformation's output is the input transformed signal 03 (denoted by y(i)). The selection and operation of a suitable transformation decoder for signals such as speech, audio or video, or other types of signals, is a matter within the knowledge of those skilled in the art.

The input transformed signal on line 03 is input to a transformed signal encoder 05. The transformed signal encoder 05 consists of parameter extraction device 06, and may or may not consist of parameter extraction memory 07. Parameter extraction device 06 is equipped to isolate and remove one or more parameters from the input transformed signal. The parameter extraction device 06 may be implemented using a parameter extraction memory 07 for storing the extracted values of one or more parameters. In the example in FIG. 2, several parameters are extracted from the transformed signal, denoted by $P_1(n)$ 08, ..., $P_M(n)$ 09. Note that the parameter extraction device 105 could extract a fewer number of parameters or a greater number of parameters than that shown in FIG. 2.

All parameters are processed by channel encoder and MUX 10, where all or some of the parameters are processed by its logic circuitry 51. All original and processed parameters are multiplexed together using a conventional multiplexer device, MUX 52. The multiplexer signal is sent out over a conventional communications channel (or stored to storage medium) 11.

The communications channel (or storage device) 11 conveys the output of the channel encoder and MUX 10 to a frame erasure/error detector 12. The frame erasure/error detector 12 is equipped to detect bit errors and/or erased frames. Such errors and erasures typically arise in the context of practical, real-world communications channels which may employ wired and/or wireless electromagnetic communications links (as well as in the context of storage media which utilize optical, magnetic, or semiconductor devices) in less-than-ideal operational environments. These communications links and/or storage media are represented schematically in FIG. 2 as communications channel 11.

Frame erasure/error detector 12 is coupled to a DEMUX and channel decoder 13. Frame erasure/error detector 12 conveys the demodulated bitstream retrieved from the communications channel (or storage medium) 11 to the DEMUX and channel decoder 13, along with an indication as to whether or not a frame erasure has occurred. DEMUX and channel decoder 13 processes the demodulated bitstream to retrieve parameters $\hat{T}(n)$ 22, and $P_1(n)$ 14, ..., $P_M(n)$ 15. In addition, the DEMUX and channel decoder 13, or the error concealment device 25, may be employed to relay the presence or absence of a frame erasure, as determined by frame erasure/error detector 12, to a transformed signal decoder 16, and/or to an output inverse (synthesis) transformation 23. Alternatively, a signal line may be provided, coupling frame erasure/error detector 12 directly to transformed signal decoder 16 and/or to an output inverse (synthesis) transformation 23, for the purpose of conveying the existence or non-existence of a frame erasure to the transformed signal decoder 16 and/or to an output inverse (synthesis) transformation 23.

The physical structure of the transformed signal decoder 16, for decoding of signals such as speech, audio, video or other types of signals, is a matter well known to those skilled in the art. Functionally, the transformed signal decoder 16, examines a plurality of parameters $\hat{T}(n)$ 22, and $P_1(n)$ 14, ..., $P_M(n)$ 15 and fetches one or more entries from codebook tables 17 stored in transformed signal decoder 16 to locate a table that is associated with, or that most closely corresponds with, the specific values of input parameters input into the transformed signal decoder 16. The table entries in the codebook table 17 may be updated and augmented after parameters for each new frame are received. In such case, new and/or amended table entries are calculated by transformed signal decoder 16 as the output inverse (synthesis) transformation 23 produces reconstructed signal output. These calculations are mathematical functions based upon the values of a given set of parameters, the values retrieved from the codebook tables, and the resulting output signal at the reconstructed signal output 24. The use of accurate codebook table entries 17 results in the generation of reconstructed signal for future frames, which most closely approximates the original input signal. The reconstructed signal is produced at the reconstructed signal output 24. If incorrect or garbled parameters are received at transformed signal decoder 16, incorrect table parameters will be calculated and placed into the codebook tables 17. As discussed previously, these parameters can be garbled and/or corrupted due to the occurrence of frame erasure or bit errors. These frame erasures or bit errors will degrade the integrity of the codebook tables 17. A codebook table 17 having incorrect table entry values will cause the generation of distorted, garbled reconstructed signal output 24 in subsequent frames.

Transformed signal decoder 16 is equipped with memory used to store parameters from present frame 20, and from Q frames 19 that proceed frame n. If no frame erasure has been detected by frame erasure/error detector 12, then the extracted code vectors are computed by transformed signal decoder 16 on line 21. If a frame erasure is detected by frame erasure/error detector 12, then the transformed signal decoder 16 can be used to compensate for the missing frame.

In the presence of frame erasure or bit errors, the transformed signal decoder 16 will not receive reliable values of decoded parameters $\hat{T}(n)$ 22, and $P_1(n)$ 14, ..., $P_M(n)$ 15, for the case where the frame n is erased. Under these circumstances, the transformed signal decoder 16 is presented with insufficient information to enable the retrieval of code vectors from the transformed signal decoder memory 18. If frame n had not been erased, these code vectors would be retrieved from the transformed signal decoder memory 18 based upon the parameter values stored in transformed signal decoder past memory 19. In this case, since the present frame parameter present memory 20 is not loaded with accurate parameters corresponding to frame n, the transformed signal decoder must generate a substitute transformed signal for use in reconstructing the output signal. This substitute transformed signal should be produced in a manner so as to accurately and efficiently compensate for the erased frame. Such an operation is called error concealment, and it is performed by the error concealment device 25, which typically uses techniques such as parameter (or signal) interpolation, extrapolation, or both. The implementation of such concealment techniques for signals such as speech, audio, video, or other types of signals, is well known to those skilled in the art.

Figure 3:
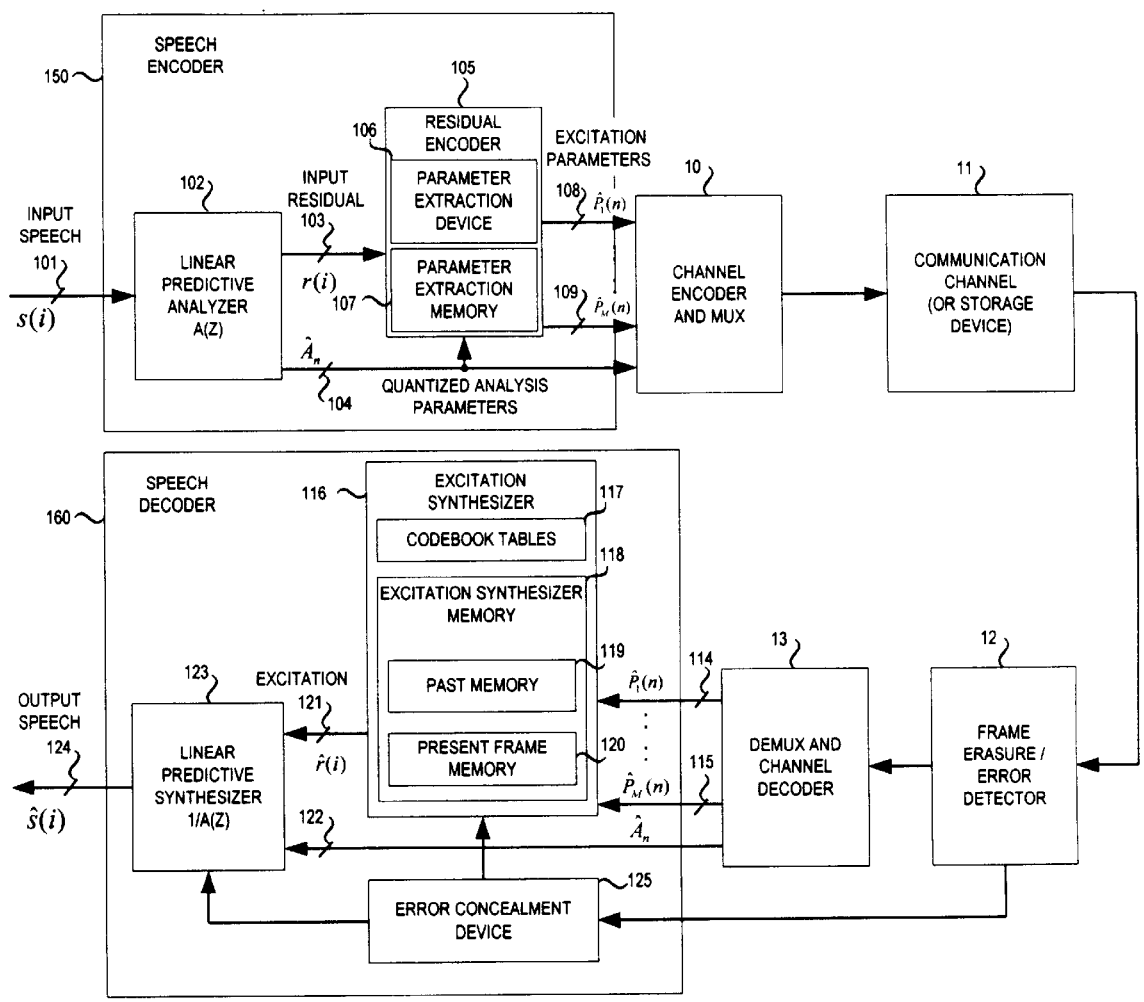
FIG. 3 is a hardware block diagram setting forth a speech coding system in accordance with a present embodiment disclosed herein.

We now provide an example of such coding system applied to coding speech signal. FIG. 3 is a hardware block diagram setting forth a speech coding system in accordance with a present embodiment disclosed below. A speech signal, represented as s(i), is coupled to a conventional speech encoder 150. Speech encoder may include elements such as an analog-to-digital converter, one or more frequency-selective filters, digital sampling circuitry, and/or an input analysis and transformation in the form of linear predictive coding (LPC) analysis 102. A speech signal is fed to the input of LPC analyzer and encoder 102. The quantized LPC coefficient vector for frame n is denoted by $\hat{A}_n$, shown on signal line 104. The digital encoding process which converts the speech to the residual domain effectively applies a filtering function A(z) to the input speech signal, an operation known as whitening. The output of the LPC whitening filter A(z) is the residual signal r(i) shown on signal line 103. The residual signal r(i) is input to the residual encoder 105. The residual signal r(i) on line 103 is input to a residual signal encoder 105. The residual signal encoder 105 consists of parameter extraction device 106, and may or may not consist of parameter extraction memory 107. Parameter extraction device 106 is equipped to isolate and remove one or more parameters from the input residual signal. The parameter extraction device 106 may be implemented using a parameter extraction memory 107 for storing the extracted values of one or more parameters. In the example in FIG. 3, several parameters are extracted from the residual signal, denoted by $P_1$ 108, ..., $P_M$ 109. Note that the parameter extraction device 105 could extract a fewer number of parameters or a greater number of parameters than that shown in FIG. 3.

The selection and operation of a suitable LPC coder, as well as a suitable residual coder, are matters within the knowledge of those skilled in the art.

All parameters are processed by channel encoder and MUX 10, where all or some of the parameters are processed by its logic circuitry 51. All original and processed parameters are multiplexed together using a conventional multiplexer device, MUX 52. The multiplexer signal is sent out over a conventional communications channel (or stored to storage medium) 11.

The communications channel (or storage device) 11 conveys the output of the channel encoder and MUX 10 to a frame erasure/error detector 12. The frame erasure/error detector 12 is equipped to detect bit errors and/or erased frames. Frame erasure/error detector 12 is coupled to a DEMUX and channel decoder 13. Frame erasure/error detector 12 conveys the demodulated bitstream retrieved from the communications channel (or storage medium) 11 to the DEMUX and channel decoder 13, along with an indication as to whether or not a frame erasure has occurred. DEMUX and channel decoder 13 processes the demodulated bitstream to retrieve parameters Ân122, and $\hat{P}_1(n)$ 114, ..., $\hat{P}_M(n)$ 115. In addition, the DEMUX and channel decoder 13, or the error concealment device 125, may be employed to relay the presence or absence of a frame erasure, as determined by frame erasure/error detector 12, to a excitation signal decoder 116 and/or to a LPC synthesizer 123. Alternatively, a signal line may be provided, coupling frame erasure/error detector 12 directly to excitation signal decoder 116 and/or to a LPC synthesizer 123, for the purpose of conveying the existence or non-existence of a frame erasure to the excitation signal decoder 116 and/or to a LPC synthesizer 123.

The digital decoding process which converts the excitation to the speech domain is performed by a linear predictive synthesizer 123, which commonly applies a filtering function 1/A(z) to the output excitation signal 121, $\hat{r}(i)$, an operation known as synthesis. The synthesis may or may not be combined with, preceded by, or followed by an additional filtering, which is used to enhance the perceived quality of the reconstructed speech. Such an additional enhancement filtering is commonly known as post-filtering. When no error occurs, the decoded LPC parameters 122, $\hat{A}_n$, are used for an LPC synthesizer 123, and the parameters $\hat{P}_1(n)$ 114, ..., $\hat{P}_M(n)$ 115 are input to an excitation synthesizer 116. The excitation signal $\hat{r}(i)$ 121 is output from the excitation synthesizer 116, and is input to the LPC synthesis filter 1/A(z) 123. The speech signal $\hat{s}(i)$ on line 124 is output from the synthesis 123.

The physical structure of the excitation signal decoder 116, and LPC synthesizer, for decoding of signals such as speech is a matter well known to those skilled in the art. Functionally, the excitation signal decoder 116, examines a plurality of parameters $\hat{A}_n$ 122, and $\hat{P}_1(n)$ 114, ..., $\hat{P}_M(n)$ 115 and fetches one or more entries from codebook tables 117 stored in excitation signal decoder 116 to locate a table that is associated with, or that most closely corresponds with, the specific values of input parameters input into the excitation signal decoder 116. The table entries in the codebook table 117 may be updated and augmented after parameters for each new frame are received. In such case, new and/or amended table entries are calculated by excitation signal decoder 116 as the output LPC synthesis filter 1/A(z) 123 produces reconstructed signal output. These calculations are mathematical functions based upon the values of a given set of parameters, the values retrieved from the codebook tables, and the resulting output signal at the reconstructed signal output 124. The use of accurate codebook table entries 117 results in the generation of reconstructed signal for future frames, which most closely approximates the original input signal. The reconstructed signal is produced at the reconstructed signal output 124. If incorrect or garbled parameters are received at excitation signal decoder 116, incorrect table parameters will be calculated and placed into the codebook tables 117. As discussed previously, these parameters can be garbled and/or corrupted due to the occurrence of frame erasure or bit errors. These frame erasures or bit errors will degrade the integrity of the codebook tables 117. A codebook table 117 having incorrect table entry values will cause the generation of distorted, garbled reconstructed signal output 124 in subsequent frames.

Excitation signal decoder 116 is equipped with memory used to store parameters from present frame 120, and from Q frames 119 that precede frame n. If no frame erasure has been detected by frame erasure/error detector 12, then the extracted code vectors are computed by excitation signal decoder 116 on line 121. If a frame erasure is detected by frame erasure/error detector 12, then the excitation signal decoder 116 can be used to compensate for the missing frame. In the presence of frame erasure or bit errors, the excitation signal decoder 116 will not receive reliable values of decoded parameters $\hat{A}_n$ 122, and $\hat{P}_1(n)$ 114, ..., $\hat{P}_M(n)$ 115, for the case where the frame n is erased. Under these circumstances, the excitation signal decoder 116 is presented with insufficient information to enable the retrieval of code vectors from the excitation signal decoder memory 118. If frame n had not been erased, these code vectors would be retrieved from the excitation signal decoder memory 118 based upon the parameter values stored in excitation signal decoder past memory 119. In this case, since the present frame parameter present memory 120 is not loaded with accurate parameters corresponding to frame n, the excitation signal decoder must generate a substitute excitation signal for use in reconstructing the output signal. This substitute excitation signal should be produced in a manner so as to accurately and efficiently compensate for the erased frame. Such an operation is called error concealment, and it is performed by the error concealment device 125, which typically uses techniques such as parameter (or signal) interpolation, extrapolation, or both. The implementation of such concealment techniques for speech signal decoders is well known to those skilled in the art.

Figure 4:
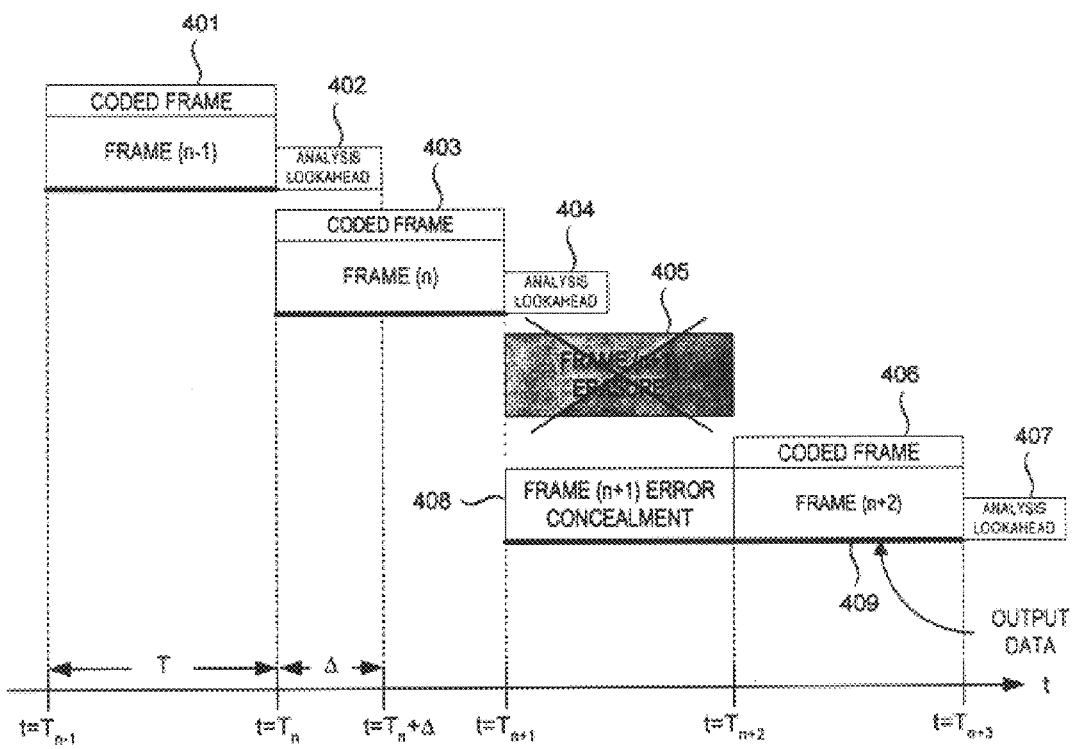
FIG. 4 is a prior art data structure diagram for use with a prior art signal compression method that could be employed in conjunction with the systems described in FIG. 1–FIG. 3, in which the encoder encodes exactly one frame at a time, such that, whenever frame erasure occurs, the decoder applies error concealment techniques, based on interpolation or extrapolation (or both), to reconstruct approximation of a whole erased frame (n+1)

FIG. 4 is a data structure diagram utilized in conjunction with a prior art signal compression method and possibly in conjunction with the systems and methods of FIG. 1–FIG. 3. At time $T_{n-1}$, the encoders encodes input frame (n−1) 401 having length T, for which it uses some look-ahead buffered data 402 of length Δ that is usually used for computing and encoding the input analysis transformation 02 (or 102). Similarly, at time $T_n$, to encode frame n 403, analysis look-ahead buffered data 404 is used. Similarly, at time $T_{n+2}$, to encode frame (n+2) 406, analysis look-ahead buffered data 407 is used. As illustrated in FIG. 4, the bits describing the parameters corresponding to frame (n+1) 405 are lost during the transmission, and therefore they are not available to the decoder. Prior art decoder will at best applies error concealment techniques, which are commonly based on interpolation or extrapolation (or both), to reconstruct approximation of a whole erased frame (n+1) 408. The decoder output data is marked by the black underline 409. Note that the number of frames to which error concealment is applied could be a greater number of frames than that shown in FIG. 4. Whenever frame erasure is detected, the prior art decoder has no way to exactly reconstruct the erased frame or frames or any part of a frame, it uses error concealment techniques to reconstruct approximation to the erased frame or frames.

Figure 5:
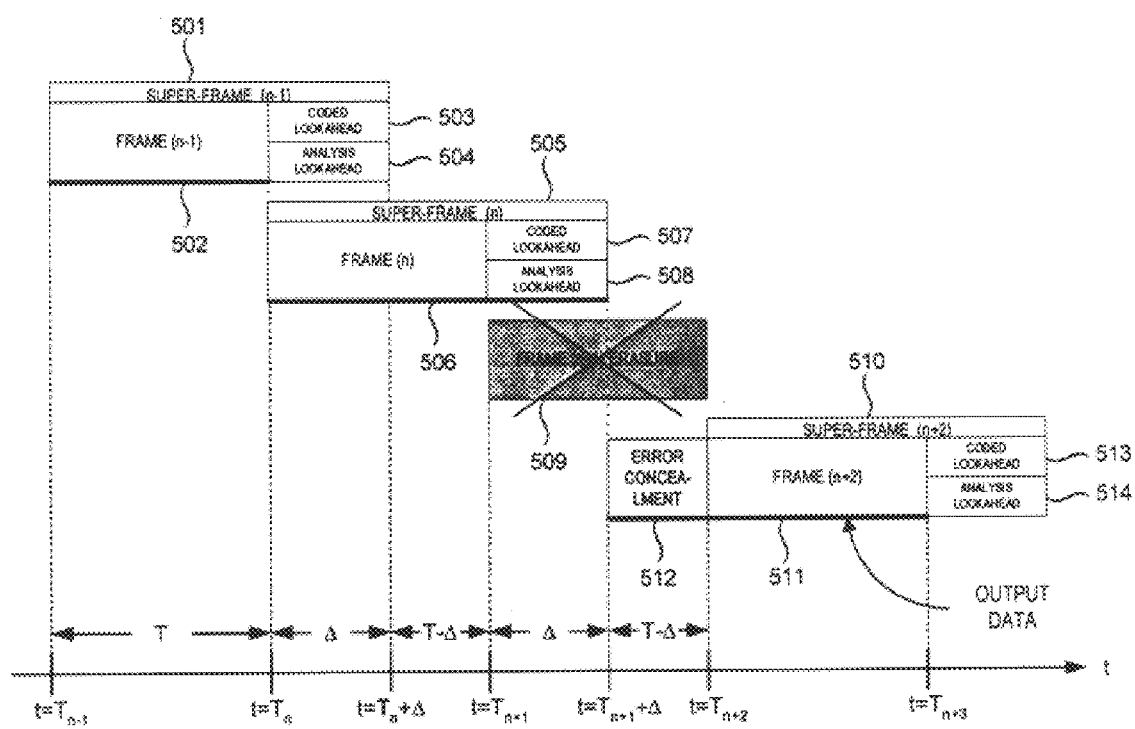
FIG. 5 is a data structure diagram for use with the signal compression methods disclosed herein, and which may be utilized in conjunction with the systems and methods of FIGS. 1–3, 11, and/or 12, in which the encoder encodes a super-frame including a frame and some look-ahead information, such that the super-frame is longer than one frame but shorter than two frames, and whenever frame erasure occurs, the decoder decodes a previous super-frame and applies error concealment techniques, which can be based on interpolation or extrapolation (or both), to reconstruct an approximation of a portion of the erased frame (n+1)

FIG. 5 is a data structure diagram for use with the signal compression methods disclosed herein, and which may be utilized in conjunction with the systems and methods of FIGS. 1–3, 11, and/or 12. The encoder encodes a super-frame (n−1) 501 having length (T+Δ), that consists of a frame 502 having length T, and some coded look-ahead 503 having length Δ, such that it is longer than one frame but shorter than two frames. The coded look-ahead length 503 may or may not be equal to the analysis look-ahead 504. At time $T_{n-1}$, for the frame (n−1), the decoder decodes only the T-length frame part 502 of the encoded super-frame 501. Similarly, at time $T_n$, the encoder encodes super-frame n 505, that consists of a frame 506 and some look-ahead 507, such that it is longer than one frame but shorter than two frames. Similarly, at time $T_{n+2}$, the encoder encodes super-frame (n+2) 510, that consists of a frame 511 and some look-ahead 513, such that it is longer than one frame but shorter than two frames.

As illustrated in FIG. 5, the bits describing the parameters corresponding to frame (n+1) 509 are lost during the transmission, and therefore they are not available at the decoder. For frames (n−1), and (n+2), the decoder decodes only the T-length frame part of the associated super-frame. Since frame (n+1) is lost, the decoder decodes the whole super-frame n, which overlaps with part of frame (n+1), and the rest of frame (n+1) 512 is approximated by error concealment techniques, which are commonly based on interpolation or extrapolation (or both). This present embodiment reduces 512 the part of lost frame that is approximated by error concealment techniques from T-length segment to (T-Δ)length segment. When the coded look-ahead length 503 is smaller than or equal to the analysis look-ahead 504, the present embodiment adds no delay to the coding system, and therefore may be very useful for applications in which the delay is limited.

Figure 6:
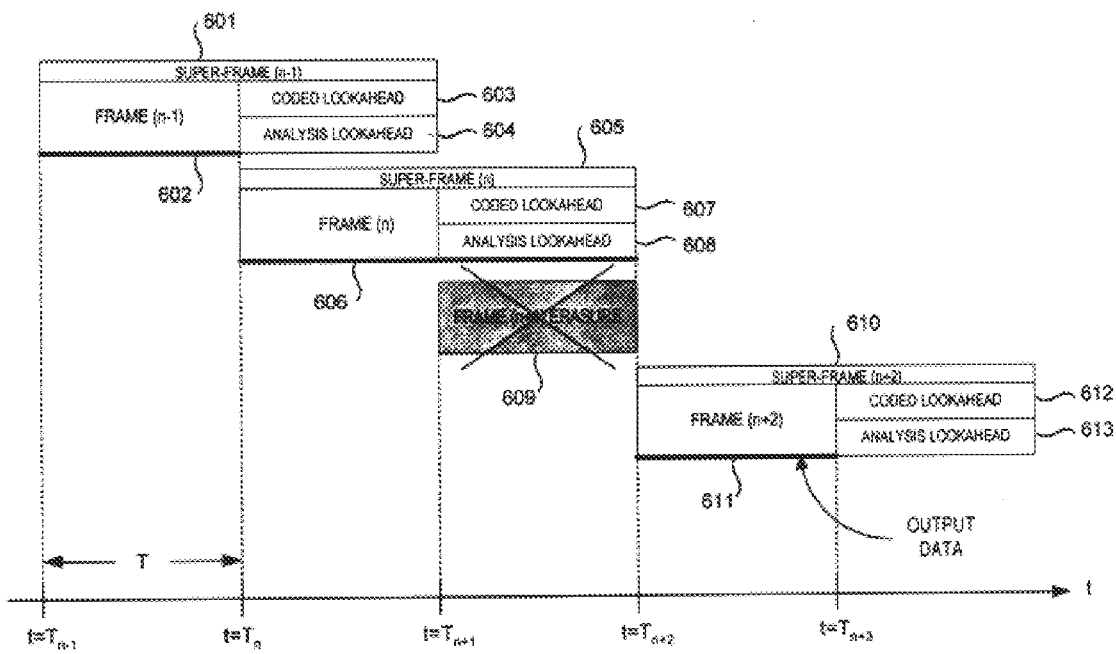
FIG. 6 is a data structure diagram for use with the signal compression methods disclosed herein, and which may be utilized in conjunction with the systems and methods of FIGS. 1–3, 11, and/or 12, in which the encoder encodes a super-frame, consists of a frame and some look-ahead, such that it is two times longer than one frame, and whenever frame erasure occurs the decoder decodes a previous super-frame and does not require any error concealment techniques for the reconstruction of the erased frame (n+1)

FIG. 6 is a data structure diagram for use with the signal compression methods disclosed herein, and which may be utilized in conjunction with the systems and methods of FIGS. 1–3, 11, and/or 12. The encoder encodes a super-frame (n−1) 601, that consists of a frame 602 having length T, and coded look-ahead 603 having length T, such that its length is equal to two frames, i.e. (2T). In general, the coded look-ahead length 603 may or may not be equal to the analysis look-ahead 604. At time $T_{n-1}$, for the frame (n−1), the decoder decodes only the frame part 602 of the encoded super-frame 601. Similarly, at time $T_n$, the encoder encodes super-frame n 605, that consists of a frame 606 and some coded look-ahead 607, such that its length is equal to two frames. Similarly, at time $T_{n+2}$, the encoder encodes super-frame (n+2) 610, that consists of a frame 611 and some look-ahead 612, such that its length is equal to two frames.

As illustrated in FIG. 6, the bits describing the parameters corresponding to frame (n+1) 609 are lost during the transmission, and therefore they are not available to the decoder. The decoder decodes the whole super-frame n, which overlaps with frame (n+1) which therefore can be fully reconstructed in spite of the erased super-frame (n+1) 609,and nothing is needed to be approximated by error concealment techniques. This present embodiment eliminates the use of error concealment approximation techniques for the reconstruction of one erased frame. In case where more than one frame is erased, then one frame may still be reconstructed by the present embodiment, and the rest may be approximated by common error concealment techniques.

Figure 7:
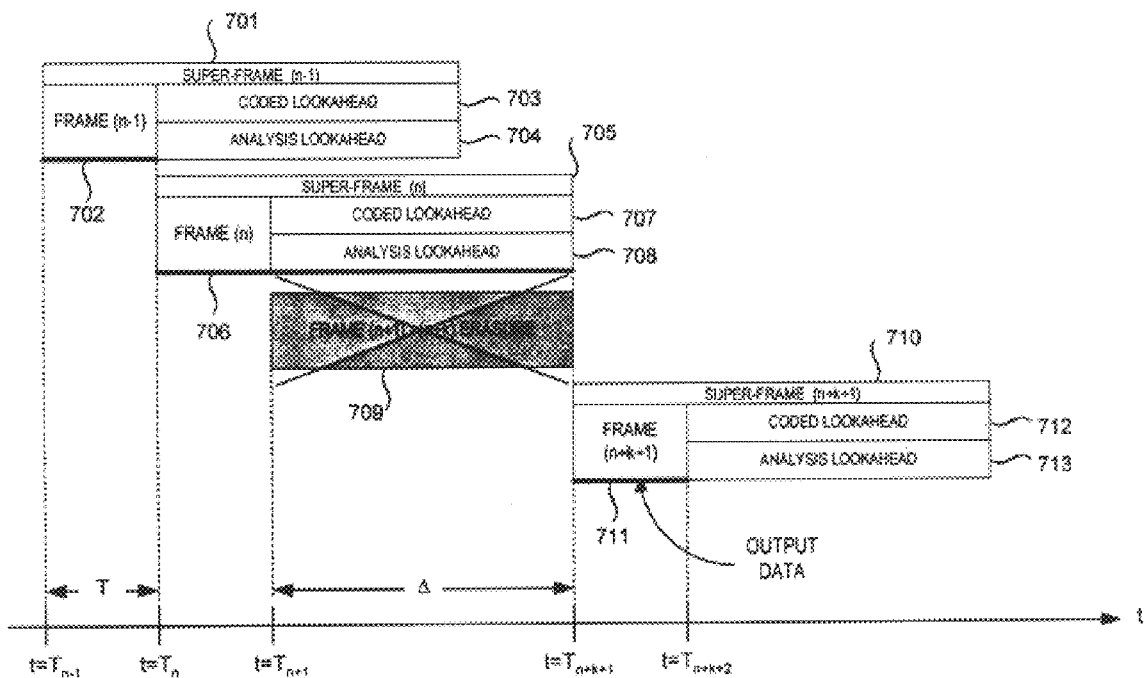
FIG. 7 is a data structure diagram for use with the signal compression methods disclosed herein, and which may be utilized in conjunction with the systems and methods of FIGS. 1–3, 11, and/or 12, in which the encoder encodes a super-frame, consists of a frame and some look-ahead, such that it is k times longer than one frame, and whenever frame erasure occurs the decoder decodes a previous super-frame and does not require any error concealment techniques for the reconstruction of k erased frames.

FIG. 7 is a data structure diagram for use with the signal compression methods disclosed herein, and which may be utilized in conjunction with the systems and methods of FIGS. 1–3, 11, and/or 12. The encoder encodes a super-frame (n−1) 701 having length (T+Δ), that consists of a frame 702 having length T, and some coded look-ahead 703 having length Δ, such that its length is equal to k frames. The look-ahead length 703 may or may not be equal to the analysis look-ahead 704. For the frame (n−1), the decoder decodes only the frame part 702 of the encoded super-frame 701. Similarly the encoder encodes super-frame n 705, that consists of a frame 706 and some coded look-ahead 707, such that its length is equal to k frames. Similarly the encoder encodes super-frame (n+k+1) 710, that consists of a frame 711 and some look-ahead 712, such that its length is equal to two frames. As illustrated in FIG. 7, the bits describing the parameters corresponding to frames (n+1)–(n+k) 709 are lost during the transmission, and therefore they are not available at the decoder. The decoder decodes the whole super-frame n, that overlaps with frames (n+1)–(n+k),. As a result these frames can be fully reconstructed from super-frame n, in spite of them being erased from super-frames (n+1)–(n+k). 709, and therefore nothing is needed to be approximated by error concealment techniques. This present embodiment eliminates the use of error concealment approximation techniques for the reconstruction of any sequence of frame lost that is no longer than k frames. In case where more than k frames are erased, then k frames may still be reconstructed by the present embodiment, and the rest may be approximated by common error concealment techniques.

Figure 8:
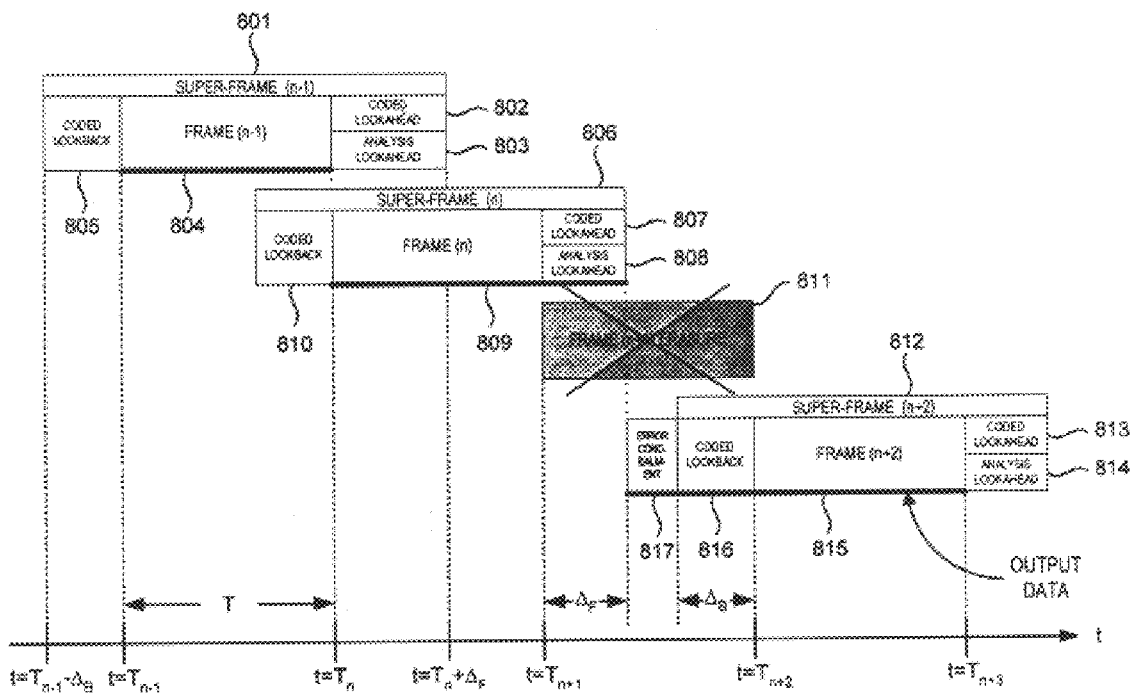
FIG. 8 is a data structure diagram for use with the signal compression methods disclosed herein, and which may be utilized in conjunction with the systems and methods of FIGS. 1–3, 11, and/or 12, in which the encoder encodes a super-frame, that consists of a frame and some look-back and look-ahead, such that it is longer than one frame but shorter than two frames, and whenever frame erasure occurs the decoder decodes a previous super-frame and applies error concealment techniques, which are commonly based on interpolation or extrapolation (or both), to reconstruct approximation of a portion of the erased frame (n+1)

FIG. 8 a data structure diagram for use with the signal compression methods disclosed herein, and which may be utilized in conjunction with the systems and methods of FIGS. 1–3, 11, and/or 12. The encoder encodes a super-frame (n−1) 801 having length $(T+\Delta_B+\Delta_F)$, that consists of a frame 804 having length T, some coded look-ahead 802 having length $\Delta_F$, and some coded look-back 805 having length $\Delta_B$, such that the super-frame is longer than one frame but shorter than two frames. The coded look-ahead length 802 may or may not be equal to the analysis look-ahead 803. The coded look-ahead length 802 and the coded look-back 805 may or may not be equal to the frame length 804. At time $T_{n-1}$, for the frame (n−1), the decoder decodes only the T-length frame part 804 of the encoded super-frame 801. Similarly, at time $T_n$, the encoder encodes super-frame n 806, that consists of a frame 809 some look-ahead 807, and some look-back 810. Similarly, at time $T_{n+2}$, the encoder encodes super-frame (n+2) 812, that consists of a frame 815 and some look-ahead 813, and some look-back 816. As illustrated in FIG. 8, the bits describing the parameters corresponding to frame (n+1) 811 are lost during the transmission, and therefore they are not available at the decoder. For frame (n−1), the decoder decodes only the T-length frame part of the associated super-frame. Since frame (n+1) is lost 811, the decoder decodes also the look-ahead part of super-frame n 807, and the look-back part of super-frame (n+2) 816, which overlaps with part of frame (n+1), and the rest of frame (n+1) 817 is approximated by error concealment techniques. This present embodiment reduces 817 the part of lost frame that is approximated by common error concealment techniques from T-length segment to $(T-\Delta_B-\Delta_F)$-length segment. When the coded look-ahead length 802 is smaller than or equal to the analysis look-ahead 803, the present embodiment adds no delay to the coding system, and therefore may be very useful for applications in which the delay is limited.

Such a system may use "memory", i.e., information about the transformed signal, such as 07 and 18 or 107 and 118, that will be used in following frames. For example such a "memory" can be implemented in the form of filter states. The super-frame may be coded respectively or irrespectively to its internal decomposition to frame, look-ahead, and look-back. In such a case where the super-frame is coded according to the decomposition to frame look-ahead, and look-back, the filter states may be updated, for example, such that in one process states are continuously updated from one frame to the next, for example from 804 to 809.

The states for the look-back coding may be updated from the previous frame states, i.e., from 804 to 810 at the beginning of 810. Alternatively, the encoder may mimic the reconstruction of look-back at the decoder, and the states and processing flow will proceed from 807 to 817 and then to 816. The state continuity between frames is similar to what is utilized in prior art coders and, therefore, we refer to this process of frame coding and inter-frame state continuity as a base layer. The additional coding of look-aheads and look-backs, which also maintains its internal state flow is herein referred to as an enhancement layer. The enhancement layer decoder may be used only whenever bit error, frame erasure or packet loss occurs. One application of such a system may be to enhance existing standard prior art coder in the base layer, by the described coding method and system in the enhancement layer. This idea is also applicable to the other configurations of look-ahead and/or look-back presented in the present embodiment.

Figure 9:
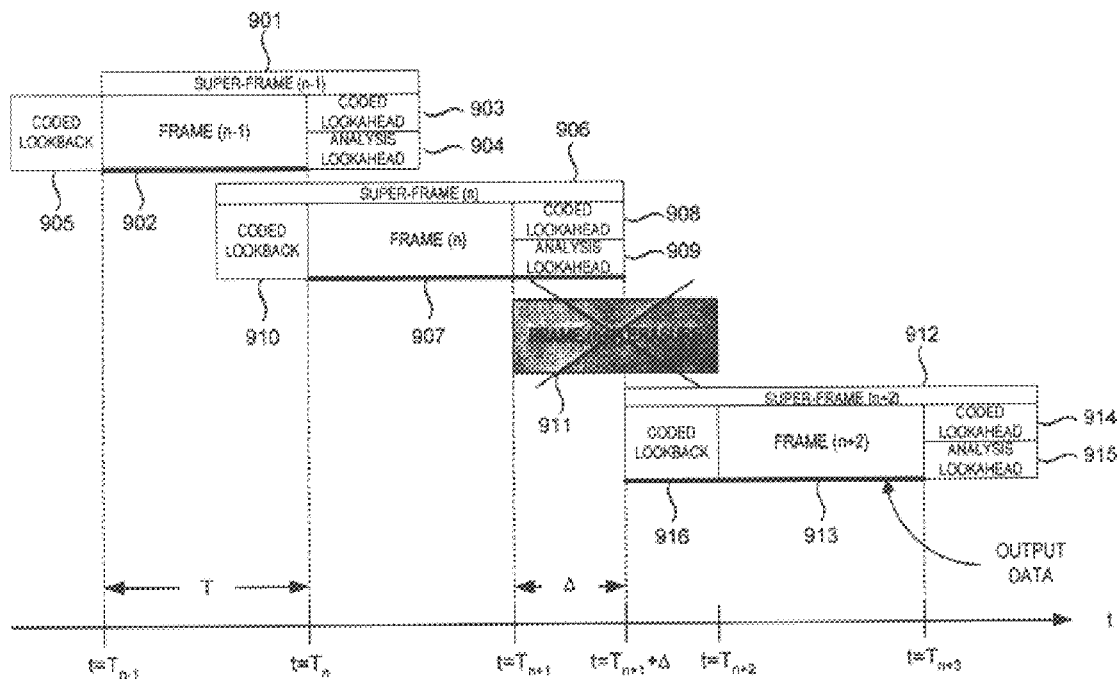
FIG. 9 is a data structure diagram for use with the signal compression methods disclosed herein, and which may be utilized in conjunction with the systems and methods of FIGS. 1–3, 11, and/or 12, in which the encoder encodes a super-frame, consists of a frame and some look-back and look-ahead, such that it is two times longer than one frame, and whenever frame erasure occurs the decoder decodes a previous super-frame and does not require any error concealment techniques for the reconstruction of the erased frame (n+1)

FIG. 9 is a data structure diagram for use with the signal compression methods disclosed herein, and which may be utilized in conjunction with the systems and methods of FIGS. 1–3, 11, and/or 12. The encoder encodes a super-frame (n−1) 901 having length $(T+\Delta_B+\Delta_F)$, that consists of a frame 904 having length T, some coded look-ahead 902 having length $\Delta_F$, and some coded look-back 905 having length $\Delta_B$, such that the super-frame is longer than one frame but shorter than two frames. The coded look-ahead length 902 may or may not be equal to the analysis look-ahead 903. The coded look-ahead length 902 and the coded look-back 905 may or may not be equal to the frame length 904. At time $T_{n-1}$, for the frame (n−1), the decoder decodes only the T-length frame part 904 of the encoded super-frame 901. Similarly, at time $T_n$, the encoder encodes super-frame n 906, that consists of a 20 frame 909 some look-ahead 907, and some look-back 910. Similarly, at time $T_{n+2}$, the encoder encodes super-frame (n+2) 912, that consists of a frame 915 and some look-ahead 913, and some look-back 916. As illustrated in FIG. 9, the bits describing the parameters corresponding to frame (n+1) 911 are lost during the transmission, and therefore they are not available at the decoder. For frame (n−1), the decoder decodes only the T-length frame part of the associated super-frame. Since frame (n+1) is lost 911, the decoder decodes also the look-ahead part of super-frame n 908, and the look-back part of super-frame (n+2) 916, which overlaps with part of frame (n+1), and nothing is needed to be approximated by common error concealment techniques. This present embodiment eliminates the use of error concealment approximation techniques for the reconstruction of one erased frame. In cases where more than one frame is erased, then one frame may still be reconstructed by the present embodiment, and the rest may be approximated by common error concealment techniques.

Such a system may use "memory", for example in the form of filter states. The super-frame may be coded respectively or irrespectively with reference to its internal decomposition to frame, look-ahead, and look-back. In such cases where the super-frame is coded according to the decomposition to frame look-ahead and look-back, the filter states may be updated, for example, such that in one process states are continuously updated from one frame to the next, for example from 902 to 907, and another process of state continuity is maintained between the look-aheads to the look-backs, i.e., states are continuously updated from 908 to 916. The state continuity between frames is similar to what is used in prior art coders, and therefore, we refer to this process of frame coding and inter-frame state continuity as a base layer. The additional coding of look-aheads and look-backs, which also maintains its internal state continuity is herein referred to as an enhancement layer. The enhancement layer decoder may be used only whenever bit error, frame erasure or packet loss occurs. One application of such a system may be to enhance existing standard prior art coders in the base layer, by using the described coding method and system in the enhancement layer. This idea is also applicable to the other configurations of look-ahead and/or look-back discussed in connection with the present embodiment.

Figure 10:
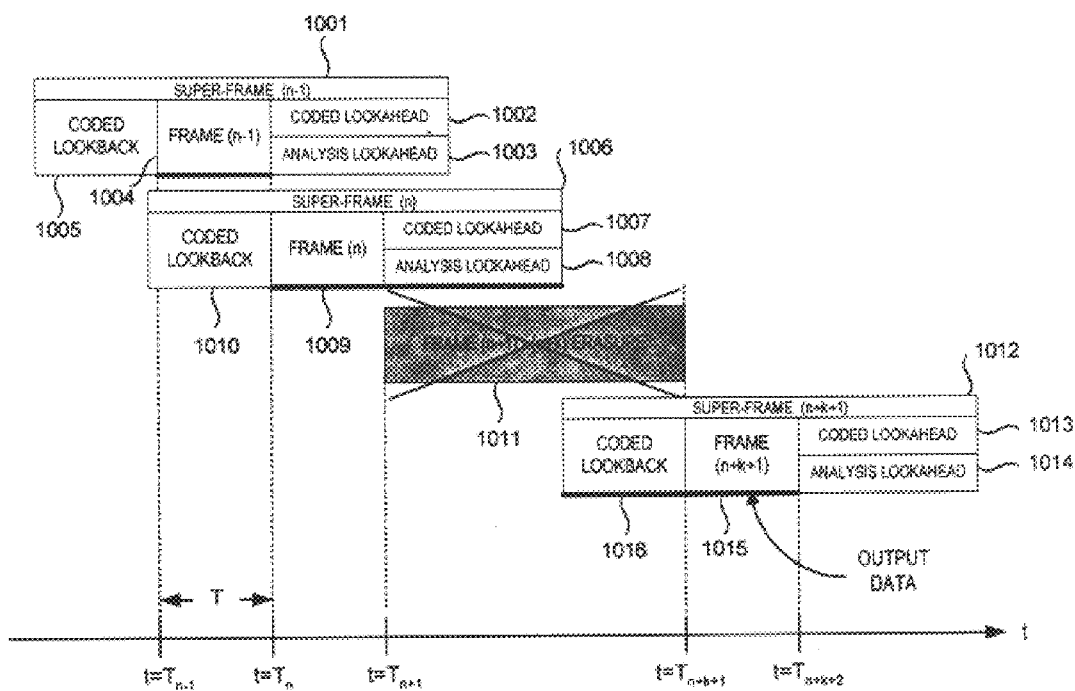
FIG. 10 is a data structure diagram for use with the signal compression methods disclosed herein, and which may be utilized in conjunction with the systems and methods of FIGS. 1–3, 11, and/or 12, in which the encoder encodes a super-frame, consists of a frame and some look-back and look-ahead, such that it is k times longer than one frame, and whenever frame erasure occurs the decoder decodes a previous super-frame and does not require any error concealment techniques for the reconstruction of k erased frames.

FIG. 10 is a data structure diagram for use with the signal compression methods disclosed herein, and which may be utilized in conjunction with the systems and methods of FIGS. 1–3, 11, and/or 12. The encoder encodes a super-frame (n−1) 1001 having length $(T+\Delta_B+\Delta_F)$, that consists of a frame 1004 having length T, some coded look-ahead 1002 having length $\Delta_F$, and some coded look-back 1005 having length $\Delta_B$, such that the super-frame's length is equal to k frames. The coded look-ahead length 1002 may or may not be equal to the analysis look-ahead 1003. The coded look-ahead length 1002 and the coded look-back 1005 may or may not be equal to the frame length 1004. At time $T_{n-1}$, for the frame (n−1), the decoder decodes only the T-length frame part 1004 of the encoded super-frame 1001. Similarly, at time $T_n$, the encoder encodes super-frame n 1006, that consists of a frame 1009 some look-ahead 1007, and some look-back 1010. Similarly, at time $T_{n+2}$, the encoder encodes super-frame (n+2) 1012, that consists of a frame 1015 and some look-ahead 1013, and some look-back 1016. As illustrated in FIG. 10, the bits describing the parameters corresponding to frames (n+1)–(n+k) 1011 are lost during the transmission, and therefore they are not available at the decoder. For frame (n−1), the decoder decodes only the T-length frame part of the associated super-frame. Since frame the bits describing the parameters corresponding to frames (n+1)–(n+k) are lost 1011, the decoder decodes also the look-ahead part of super-frame n 1008, and the look-back part of super-frame (n+2) 1016, which overlaps with part of frames the bits describing the parameters corresponding to frames (n+1)–(n+k), and nothing needs to be approximated by common error concealment techniques. This present embodiment eliminates the use of common error concealment approximation techniques for the reconstruction of any sequence of erased frames that is no longer than k frames. In case where more than k frames are erased, then k frames may still be reconstructed by the present embodiment, and the rest may be approximated by common error concealment techniques.

Figure 11:
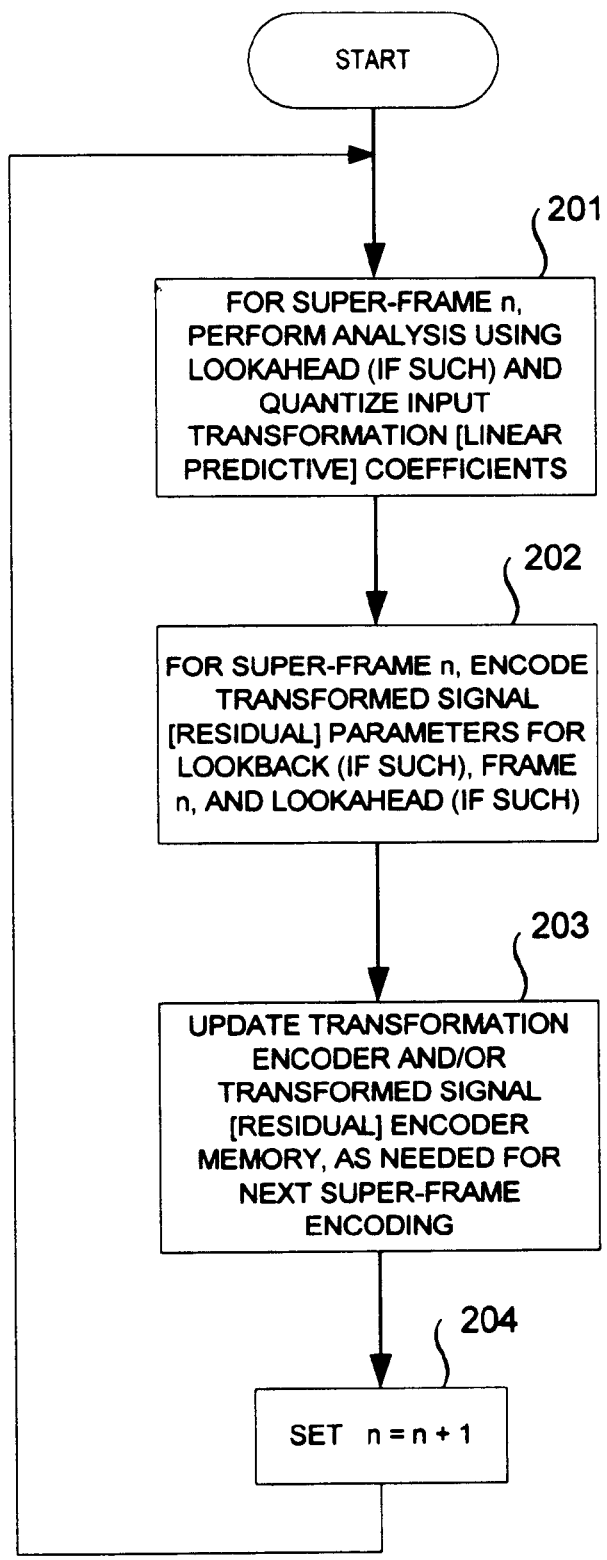
FIG. 11 is a software flowchart setting forth a speech encoding method performed in accordance with a preferred embodiment disclosed herein.

FIG. 11 is a software flowchart setting forth a speech encoding method performed in accordance with a present embodiment disclosed herein. The program commences at block 201, where input analysis transformation (LPC in speech coding) is computed and quantized. This computation may or may not require buffered signal look-ahead. The transformation encoder may or may not require "memory", i.e. information about the transformation that will be used in following frames. From block 201, the program progresses to block 202, where the input transformed signal (residual signal in speech coding) is computed and quantized for the super-frame n. This computation may or may not require look-ahead or look-back, but requires at least one of them. The transformed signal encoder (residual signal encoder in speech coding) may or may not require "memory", i.e. information about the transformed signal that will be used in following frames. From block 202, the program progresses to block 203, where the transformation encoder and/or the transformed signal encoder are updated (filter states, and codebook table update in speech coding) as needed for next super-frame encoding. From block 203, the program progresses to block 204, where n is incremented by setting n=n+1, and the program loops back to block 201 to encode the next super-frame.

Figure 12:
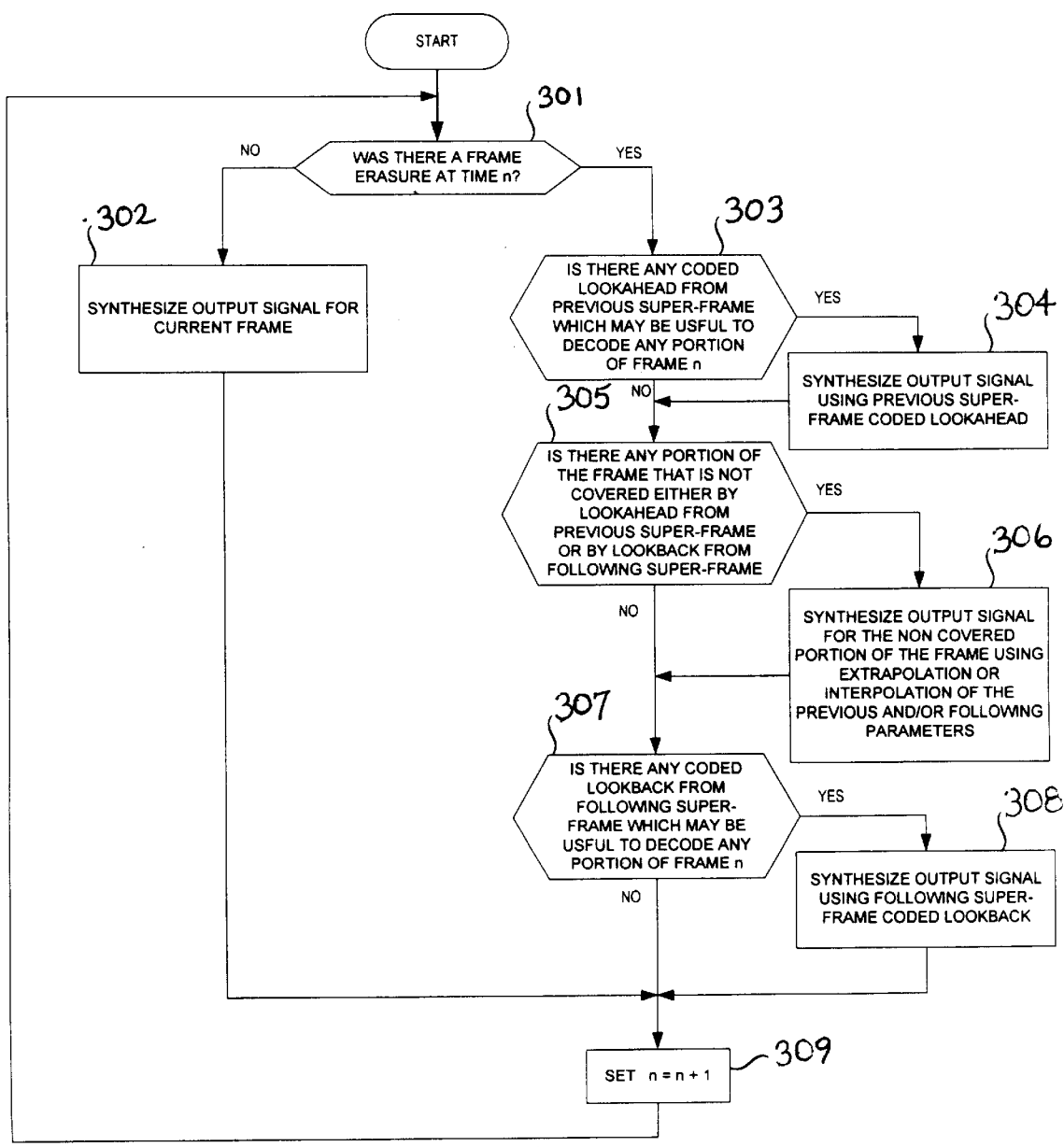
FIG. 12 is a software flowchart setting forth a speech decoding method performed in accordance with a preferred embodiment disclosed herein.

FIG. 12 is a software flowchart setting forth a speech decoding method performed in accordance with a present embodiment disclosed herein. The program commences at block 301, where a test is performed to ascertain whether or not a frame erasure occurred at time n. The negative branch from block 301 leads to block 302, where the program performs decoding of the current frame and reconstructs the output signal for the current frame. Next, n is incremented by setting n=n+1 at block 309, and the program loops back to block 301.

The positive branch from block 301 leads to block 303, where a test is performed to ascertain whether or not any coded look-ahead from previous super-frame may be useful to decode any portion of frame n. If so, program control progresses to block 304 where output signal is reconstructed for certain portion of frame n or all of it, using look-ahead from previous super-frame. From block 304, or from the negative branch of block 303, the program control progresses to block 305, where a test is performed to ascertain whether or not any portion of the frame n is not covered by either look-ahead from previous super-frame or by look-back from following super-frame. If so, program control progresses to block 306 where it uses common error concealment techniques which are commonly based on interpolation or extrapolation (or both), to reconstruct approximation of the output signal. From block 306, or from the negative branch of block 305, the program control progresses to block 307, where a test is performed to ascertain whether or not any coded look-ahead from previous super-frame may be useful to decode any portion of frame n. If so, program control progresses to block 308 where output signal is reconstructed for certain portion of frame n or all of it, using look-back from following super-frame. From block 308, or from the negative branch of block 307, the program control progresses to block 309, where n is incremented by setting n=n+1, and the program loops back to block 301.

The described embodiments can be generalized to coding systems for multidimensional signals. For example, such multidimensional signals may include two dimensional signals such as images, three dimensional signals such as video, or any other multidimensional signal such as signals received by a microphone array or a seismic sensor array, or surround-sound signals.

We will now show the manner in which an illustrative embodiment of the invention is generalized to two dimensional signals, such as a signal that represents an image having a first axis X, and a second axis Y. FIG. 13 is a data structure diagram for use with the signal compression method in accordance with a preferred embodiment disclosed herein and in conjunction with the systems and methods of FIGS. 3, 11, and/or 12. The encoder encodes a super-frame at $(x_n, y_n)$ 1101 (overlapping with a successive super-frame at $(x_{n+1}, y_n)$ 1102, at $(x_n, y_{n+1})$ 1103, and at $(x_{n+1}, y_{n+1})$ 1104), having dimension $(T_x+\Delta_x)$ by $(T_y+\Delta_y)$, that consists of a frame 1108 having length $T_x$, and some coded look-ahead 1105 in the X direction, 1106 in the Y direction, and 1107 in the X and Y directions. The X direction look-ahead has length $\Delta_x$, and the Y direction look-ahead has length $\Delta_y$. The operation of this system along the X axis, as well as along the Y axis, is similar to that of FIG. 5. Observe that the operation of such a system along any axis can be generalized to any one of the embodiments and methods of FIGS. 6 to 10. The encoder and decoder of FIGS. 11 and 12 can be utilized to process the signal along any direction.

We will now describe a preferred embodiment of the invention which is generalized to three-dimensional signals such as video, whose axes are X, Y, and Z. For simplicity, we will first describe the operation along each axis separately, but these operational principles may be utilized for more than one axis concurrently.

Figure 14:
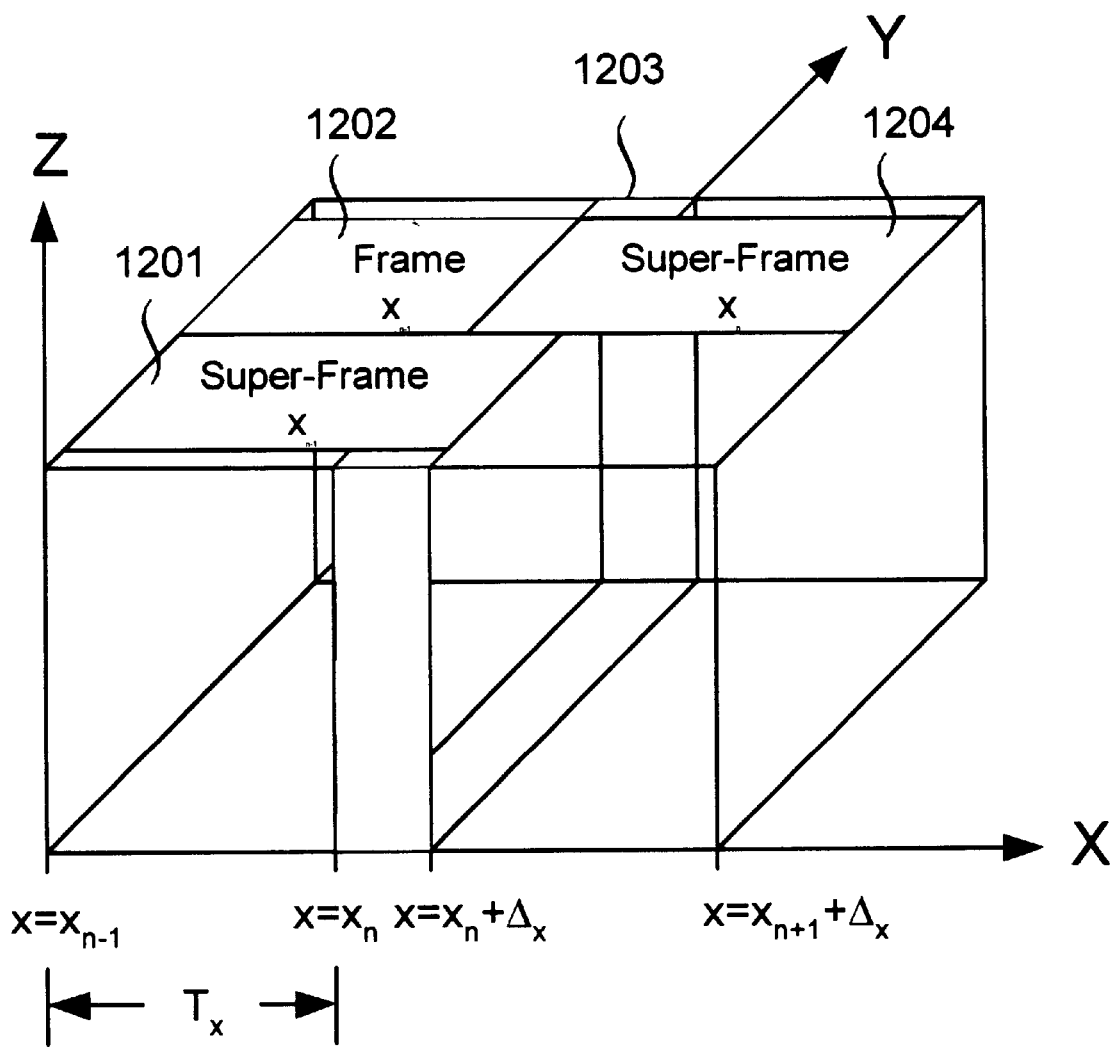
FIG. 14 is a data structure diagram of a three-dimensional signal compression method in accordance with a preferred embodiment disclosed herein for use in conjunction with the systems and methods of FIGS. 1, 3, 11, and/or 12, in which super-frames have overlap $\Delta_x$ along the X axis. The encoder encodes a super-frame including a frame and some X axis look-ahead information, such that along the X axis the super-frame is longer than one frame but shorter than two frames, and whenever frame erasure occurs, the decoder decodes a previous super-frame and applies error concealment techniques, which can be based on interpolation or extrapolation (or both), to reconstruct an approximation of a portion of the erased frame along the X axis.

FIG. 14 is a data structure diagram for use with any of the signal compression methods disclosed herein, and which may be utilized in conjunction with the systems and methods of FIG. 3, 11, and/or 12. The encoder encodes a super-frame at $x_{n-1}$ 1201 (overlapping with a successive super-frame at $x_n$ 1204), having length $(T_x+\Delta_x)$, that consists of a frame 1202 having length $T_x$, and some coded look-ahead 1203 having length $\Delta_x$, such that it is longer than one frame but shorter than two frames. The operation of this system along the X axis is similar to that of FIG. 5. Likewise, the operation of such a system along the X axis can be generalized to any one of the embodiments described in FIGS. 6 to 10. The encoder and decoder described in FIGS. 11 and 12 can be utilized to process the signal along the X axis.

Figure 15:
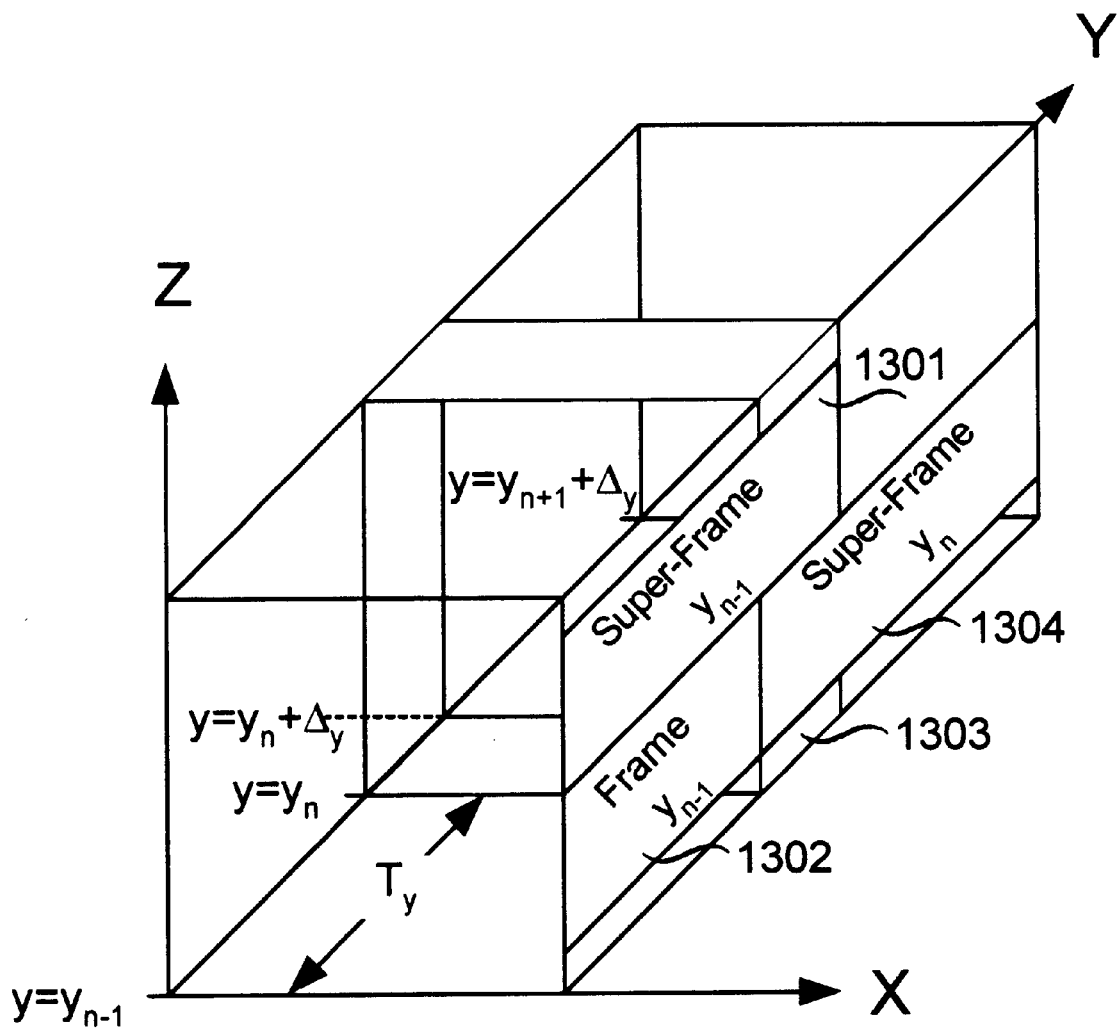
FIG. 15 is a data structure diagram of a three-dimensional signal compression method in accordance with a preferred embodiment disclosed herein for use in conjunction with the systems and methods of FIGS. 1, 3, 11, and/or 12, in which super-frames have overlap $\Delta_y$ along the Y axis. The encoder encodes a super-frame including a frame and some Y axis look-ahead information, such that along the Y axis the super-frame is longer than one frame but shorter than two frames, and whenever frame erasure occurs, the decoder decodes a previous super-frame and applies error concealment techniques, which can be based on interpolation or extrapolation (or both), to reconstruct an approximation of a portion of the erased frame along the Y axis.

FIG. 15 is a data structure diagram for use with any of the signal compression methods disclosed herein, and which may be utilized in conjunction with the systems and methods described in FIGS. 1, 3, 11, and/or 12. The encoder encodes a super-frame at $y_{n-1}$ 1301 (overlapping with a successive super-frame at $y_n$ 1304), having length $(T_y+\Delta_y)$, that consists of a frame 1302 having length $T_y$, and some coded look-ahead 1303 having length $\Delta_y$, such that it is longer than one frame but shorter than two frames. The operation of such a system along the Y axis is similar to that of FIG. 5. Likewise, the operation of this system along the Y axis can be generalized to any one of the embodiments described in FIGS. 6 to 10. The encoder and decoder described in FIGS. 11 and/or 12 can be utilized to process the signal along the Y axis.

Figure 16:
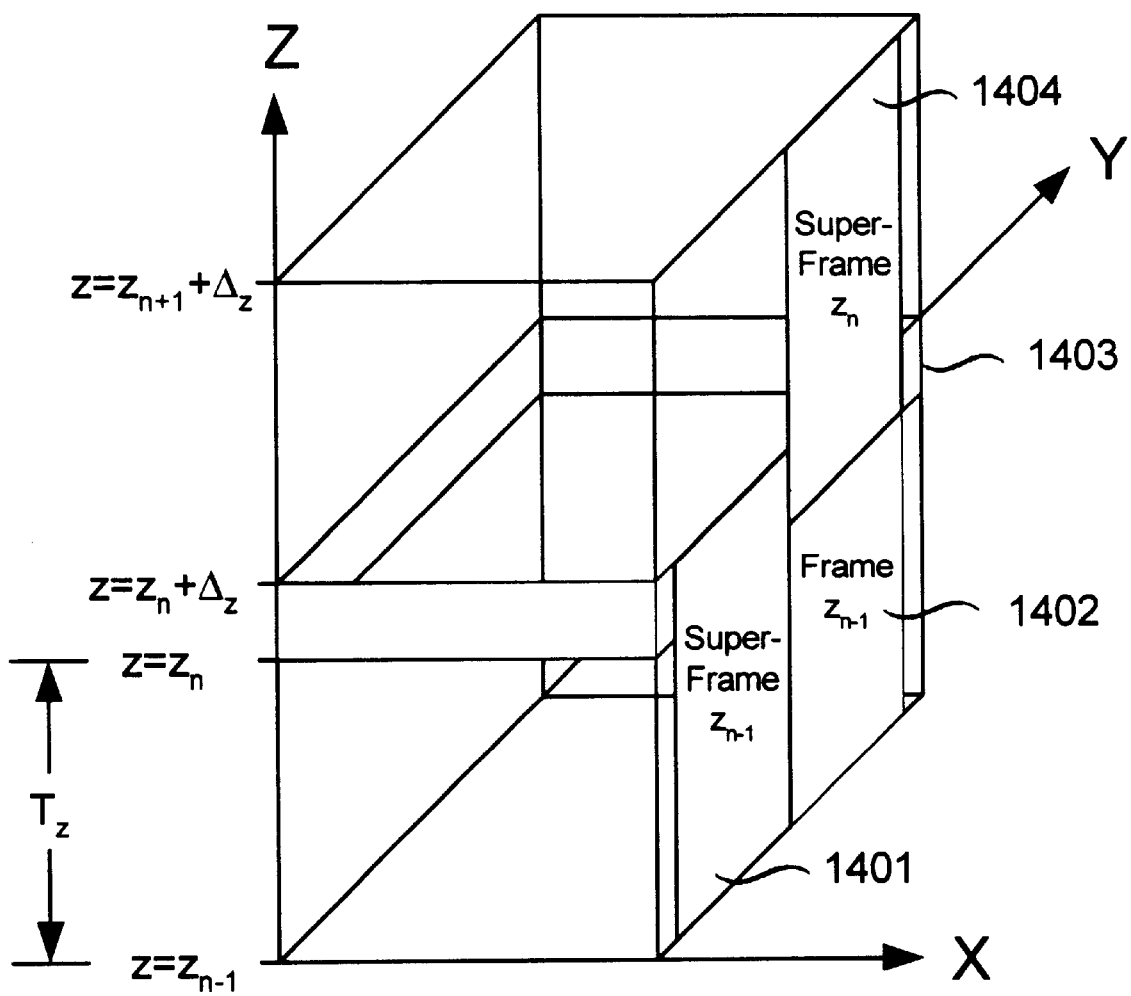
FIG. 16 is a data structure diagram of a three-dimensional signal compression method in accordance with a preferred embodiment disclosed herein for use in conjunction with the systems and methods of FIGS. 1, 3, 11, and/or 12, in which super-frames have overlap $\Delta_z$ along the Z axis. The encoder encodes a super-frame including a frame and some Z axis look-ahead information, such that along the Z axis the super-frame is longer than one frame but shorter than two frames, and whenever frame erasure occurs, the decoder decodes a previous super-frame and applies error concealment techniques, which can be based on interpolation or extrapolation (or both), to reconstruct an approximation of a portion of the erased frame along the Z axis.

FIG. 16 is a data structure diagram for use with any of the signal compression methods disclosed herein, and which may be utilized in conjunction with the systems and methods of FIGS. 1, 3, 11, and/or 12. The encoder encodes a super-frame at $z_{n-1}$ 1401 (overlapping with a successive super-frame at $z_n$ 1404), having length $(T_z+\Delta_z)$, that consists of a frame 1402 having length $T_z$, and some coded look-ahead 1403 having length $\Delta_z$, such that it is longer than one frame but shorter than two frames. The operation of such a system along the Z axis is similar to that of FIG. 5. Similarly, the operation of this system along the Z axis can be generalized to any one of the embodiments described in FIGS. 6 and 10. The encoder and decoder described in FIGS. 11 and 12 can be utilized to process the signal along the Z axis.

The operation of a system that is used to code multidimensional signals may utilize super-frames along at least one of the multidimensional signal's axes, and may utilize similar or different embodiments for each one of the various additional axes. In such cases, the frame and the super-frame are typically also multidimensional. The encoder and decoder described in FIGS. 11 and 12 can be generalized to process multidimensional signals along the various axes jointly or independently. Such generalizations will be apparent to those of ordinary skills in the art.

It should, of course, be noted that while the present invention has been described in terms of various illustrative embodiments, other arrangements will be apparent to those of ordinary skills in the art. For example:

While the embodiment of FIG. 3 has been described relative to the hardware block diagram of a coding system that uses digital signals representative of speech, the present invention is applicable to the processing of compressed digital signals regardless of the information represented by such signals.

The disclosed embodiments did not explicitly show use of a feedback apparatus from the decoder to the encoder, an error control coding apparatus, a frame buffering apparatus such as jitter buffering used in voice-over-Internet-protocol, or an enhancement apparatus such as noise cancellation, echo cancellation or suppression, but the coding system of the present invention can incorporate any of these elements, either as part of the encoding system or otherwise.

While some of the disclosed embodiments refer to the reconstruction of an entire frame, the techniques of the invention may also be applied to situations where only a portion of the frame bits are corrupted or lost, and a part of the frame is reconstructed. Also, since many coding methods utilize frames which may be divided into sub-frames, the techniques of the present invention may be applied not only to an entire frame, but also (or instead) to a sub-frame or other part of a frame.

While, in the disclosed embodiments, one coding system and one channel were utilized, in other coding arrangements, a plurality of coding systems, encoders, decoders, and channels interconnected or cascaded to each other may be utilized.

While, in the disclosed embodiments, a coding system and a transmission channel are utilized, in other applications, a storage medium can be used instead of a communications channel.

While, in the disclosed embodiment of FIG. 11, the update of the transformation encoder and/or the transformed signal encoder memory is utilized 203 after encoding is performed by 201 and 202, other arrangements will be apparent to those of ordinary skill in the art. One example is interchanging the order and performing updates 203 at the beginning of the super-frame encoding loop before encoding is performed by 201 and 202.

While, in the disclosed embodiment of FIG. 11, the processing blocks 201–203 are applied to the super-frame, other arrangements will be apparent to those of ordinary skills in the art. For example, at least one of these processing blocks 201–203 can be further subdivided into sub-blocks which process sub-sections of the super-frame, such as the look-back and/or the frame and/or the look-ahead. In such a case, for example, the order of some or all of the sub-blocks and/or the blocks may also be interchanged.

While, in the disclosed embodiment of FIG. 12, look-ahead is utilized first (303 and 304), followed by error concealment (305 and 306) and then by look-back (307 and 308), other arrangements will be apparent to those of ordinary skills in the art. Examples are interchanging the order of any such pair of blocks (303 and 304), (305 and 306), or (307 and 308) with another pair of blocks. In some systems, the error concealment pair (305 and 306) may be omitted, and/or one of the two other pairs (303 and 304) or (307 and 308), may be omitted.

While the disclosed embodiments of FIG. 7 and FIG. 10 have described super-frames having length which is equal to (k+1)T, other arrangements will be apparent to those of ordinary skills in the art. For example, the super-frame length may be larger, but may not be an exact multiple of the frame length.

While the disclosed embodiments of FIG. 5–FIG. 10 have described fixed-length super-frames, in other coding arrangements, variable length super-frame may be used.

While the disclosed embodiments have been described using a fixed set of coded parameters, and a fixed encoder and decoder, other coding arrangements, such as variable bit-rate coding, multimode coding, channel controlled coding or source controlled coding, may ho be utilized.

While the disclosed embodiments have been described in terms of sets of bits that are used to code a super-frame consisting of frames and look-ahead and/or look-back, other coding arrangements, such as the parameter set and/or the coding method that is/are used to code the look-ahead and/or the look-back and/or the frame parts of the super-frame, may be different from each other.

While the disclosed embodiments have described methods and systems for encoding super-frames, this encoding process may be applied in various ways, including encoding of the frame as a base layer, and then coding a look-ahead and/or look-back. In such cases, an existing, possibly standard, coding scheme may operate as a base layer, and the present invention can be used as an enhancement layer for less than ideal channel environments, by coding an additional look-ahead and/or look-back.

While the disclosed embodiments have been described as advantageous for coding under frame erasure or packet loss conditions, these techniques may be applied to other bit error occurrences that are not frame erasures or packet losses.

While the disclosed embodiments have been described as coding signals along the time axis and using various time intervals, the invention can also be utilized to code signals that may be described with reference to an axis or axes other than time, such as in the case of image or video coding. In any case, the coding segments such as frame, super-frame, look-ahead or look-back, may be defined and/or measured according to the respective signal axis, or axes in multidimensional cases.

Finally, while the disclosed embodiments are shown as utilizing discrete devices, these devices can be implemented using one or more appropriately programmed general purpose processors, or special purpose integrated circuits, or digital processors, or an analog or hybrid counterpart of any of these devices.

I claim:

1. A signal encoding and decoding method for transmitting data over a communications path subject to possible degradation, the signal including one or more parameters, the method comprising the steps of:
   (a) partitioning the signal into a plurality of overlapped super-frames, encoding each super-frame by one or more signal parameters, encoding each super-frame into a predetermined number of bits; each super-frame including an overlapping portion which includes redundant information from at least one other super-frame;
   (b) decoding an encoded super-frame into a decoded frame, wherein the decoded frame does not include redundant information from other frames if at least one of: (i) a bit so error, (ii) a packet loss, or (iii) a frame erasure, of the encoded super-frame has not occurred over the communications path; and
   (c) using redundant information derived from the overlapping portion of the super-frame to reconstruct a frame or a part of a frame if at least one of: (i) a frame erasure, (ii) a bit error or (iii) a packet loss, of the encoded super-frame has occurred over the communications path.

2. A signal encoding and decoding method for storing data on a medium subject to possible degradation, the signal including one or more parameters, the method comprising the steps of:
   (a) partitioning the signal into a plurality of overlapped super-frames, encoding each super-frame by one or more signal parameters, encoding each super-frame into a predetermined number of bits; each super-frame including an overlapping portion which includes redundant information from at least one other super-frame;
   (b) decoding an encoded super-frame into a decoded frame, wherein the decoded frame does not include redundant information from other frames if at least one of: (i) a bit to error, (ii) a packet loss, or (iii) a frame erasure, has not occurred during a data reading operation of the encoded super-frame on the medium; and
   (c) using redundant information derived from the overlapping portion of the super-frame to reconstruct a frame or a part of a frame if at least one of: (i) a frame erasure, (ii) a bit error, or (iii) a packet loss, has occurred during a data reading operation of the encoded super-frame on the medium.

3. A signal decoding method for transmitting data over a communications path subject to possible degradation; the signal including one or more parameters, wherein one or more parameters have been encoded into a plurality of overlapped encoded super-frames, each super-frame having a predetermined number of bits; each super-frame including an overlapping portion which includes redundant information from at least one other super-frame; the method comprising the steps of:
   (a) decoding an encoded super-frame into a decoded frame, wherein the decoded frame does not include redundant information from other frames if at least one of: (i) a bit error, (ii) a packet loss, or (iii) frame erasure, of the encoded super-frame has not occurred over the communications path; and
   (b) using redundant information derived from the overlapping portion of the super-frame to reconstruct a frame or a part of a frame if at least one of: (i) a frame erasure, (ii) a bit error, or (iii) a packet loss of the encoded super-frame has occurred over the communications path.

4. A signal decoding method for storing data on a medium subject to possible degradation, the signal including one or more parameters, wherein one or more parameters have been encoded into a plurality of overlapped encoded super-frames, each super-frame having a predetermined number of bits; each super-frame including an overlapping portion which includes redundant information from at least one other super-frame;
   the method comprising the steps of:
   (a) decoding an encoded super-frame into a decoded frame, wherein the decoded frame does not include redundant information from other frames if at least one of: (i) a bit error, (ii) a packet loss, or (iii) a frame erasure, has not occurred during a data reading operation of the encoded super-frame on the medium; and
   (b) using redundant information derived from the overlapping portion of the super-frame to reconstruct a frame or a part of a frame if at least one of: (i) a frame erasure, (ii) a bit error, or (iii) packet loss, has occurred during a data reading operation of the encoded super-frame on the medium.

5. A signal encoding method for transmitting data over a communications path subject to possible degradation, the signal including one or more parameters, the method comprising the steps of:

(a) partitioning the signal into a plurality of overlapped super-frames, encoding each super-frame by one or more signal parameters, encoding each super-frame into a predetermined number of bits; each super-frame including an overlapping portion which includes redundant information from at least one other super-frame;

(b) transmitting the encoded super-frames over the communications path for subsequent decoding, wherein a decoded frame does not include redundant information from other frames if at least one of: (i) a bit error, (ii) a packet loss, or (iii) frame erasure, of the encoded super-frame has not occurred over the communications path; and using redundant information derived from the overlapping portion of the super-frame to reconstruct a frame or a part of a frame if at least one of: (i) a frame erasure, (ii) a bit error, or (iii) a packet loss, of the encoded super-frame has occurred over the communications path.

6. A signal encoding method for storing data on a medium subject to possible degradation, the signal including one or more parameters, the method comprising the steps of:

(a) partitioning the signal into a plurality of overlapped super-frames, encoding each super-frame by one or more signal parameters, encoding each super-frame into a predetermined number of bits; each super-frame including an overlapping portion which includes redundant information from at least one other super-frame;

(b) storing the encoded super-frames on the medium for subsequent reading and decoding, wherein a decoded frame does not include redundant information from other frames if at least one of: (i) a bit error, (ii) a packet loss, or (iii) frame erasure, has not occurred during a data reading operation of the encoded super-frame on the medium; and using redundant information derived from the overlapping portion of the super-frame to reconstruct a frame or a part of a frame if at least one of: (i) a frame erasure, (ii) a bit error, or (iii) packet loss, has occurred during a data reading operation of the encoded super-frame on the medium.

7. The method of claim 3 for use as an enhancement layer added to an existing coding technique wherein the existing coding technique operates as a base layer, and steps (a)–(c) operate as an enhancement layer for less than ideal communication paths.

8. The method of claim 4 for use as an enhancement layer added to an existing coding technique wherein the existing coding technique operates as a base layer, and steps (a)–(c) operate as an enhancement layer for less than ideal data storage media.

9. In a signal coding system for coding a signal into a plurality of sequential frames on a coded bitstream, an error compensation method comprising the steps of:

(a) adding redundant information to the coded bitstream; and (b) upon an occurrence of at least one of: (i) a bit error, (ii) a packet loss, or (iii) a frame erasure, utilizing the added redundant information to reconstruct parts of an erased frame or a whole erased frame or frames of the coded bitstream.

10. The method of claim 9 wherein the redundant information is provided in the form of super-frames, wherein each super-frame is longer in duration than a decoded frame.

11. The method of claim 10 wherein the redundant information is based upon look-ahead information from a previous super-frame and/or look-back information from a succeeding super-frame.

* * * * *